(12) United States Patent
Kuge

(10) Patent No.: US 6,351,169 B2
(45) Date of Patent: *Feb. 26, 2002

(54) INTERNAL CLOCK SIGNAL GENERATING CIRCUIT PERMITTING RAPID PHASE LOCK

(75) Inventor: Shigehiro Kuge, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/273,546

(22) Filed: Mar. 22, 1999

(30) Foreign Application Priority Data

Oct. 23, 1998 (JP) ............................................ 10-302804

(51) Int. Cl.$^7$ .................................................. H03L 7/00
(52) U.S. Cl. ..................... 327/161; 327/149; 327/158; 327/285; 375/376; 331/DIG. 2
(58) Field of Search ................................ 327/277, 278, 327/284–285, 146, 147, 149, 150, 153, 155, 156, 158, 159, 161, 272; 375/373–376; 331/11, 12, 17, 25, 40, 1 A, DIG. 2; 365/233, 233.5

(56) References Cited

U.S. PATENT DOCUMENTS 5,604,775 A * 2/1997 Saitoh et al. ................ 375/376
5,790,612 A * 8/1998 Chengson et al. ........... 375/373

FOREIGN PATENT DOCUMENTS

JP          10-79663        3/1998

* cited by examiner

*Primary Examiner*—Timothy P. Callahan
*Assistant Examiner*—Minh Nguyen
(74) *Attorney, Agent, or Firm*—McDermott, Will & Emery

(57) ABSTRACT

An internal clock signal generating circuit according to the present invention has a minute delay stage that can change a delay amount minutely and a delay stage that changes its delay amount by a larger amount. The minute delay stage responds to a control signal output from a control circuit and fine adjusts its delay amount. The delay stage includes a plurality of fixed delay circuits that realize a relatively large delay amount, respectively. The fixed delay circuit to be connected to the minute delay stage is selected based on the control of the control unit. Accordingly, internal clock signal generating circuit is applicable to a wide range of frequency, occupying a very small space.

14 Claims, 39 Drawing Sheets

FIG.10

| Q0 | Q1 | Q2 | SEL0 | SEL1 | SEL2 | SEL3 |
|---|---|---|---|---|---|---|
| L | L | L | H | L | L | L |
| H | L | L | L | H | L | L |
| H | H | L | L | L | H | L |
| H | H | H | L | L | L | H |

WITH MASKING

WITHOUT MASKING

ZUP=L

ZDOWN=L

ZLOCK=L

INTERNAL CLOCK SIGNAL GENERATING CIRCUIT PERMITTING RAPID PHASE LOCK

BACKGROUND OF THE INVENTION

1. Field of the Invention

The present invention relates to a circuit for generating a second clock signal in synchronization with a first clock signal and a testing method of the circuit. More particularly, the present invention relates to an internal clock signal generating circuit for generating an internal clock signal in synchronization with an external clock signal in a synchronous semiconductor memory device, a phase comparator, and a testing method of the internal clock signal generating circuit.

2. Description of the Background Art

In a synchronous semiconductor memory device, there is a need to generate an internal clock signal within a chip as desired in order to time the operation of the device to a desired external clock signal. It is difficult, however, to generate such internal clock signal to suit for various types of frequencies, power supply sources, or interfaces.

A DLL (Delayed Line Loop) circuit has thus been used for shifting phases so as to obtain a desired internal clock signal.

A DDR-SDRAM (Double Data Rate SDRAM) is an example of the synchronous semiconductor memory device. FIG. 42 shows a timing chart for use in illustration of the output timing of DDR-SDRAM. In FIG. 42, reference characters extCLK, DQ and intCLKD represent an external clock signal, an output data, and an internal clock signal, respectively.

Referring to FIG. 42, data are output corresponding to rising and falling edges of external clock signal extCLK in a DDR-SDRAM. To output data in phase with external clock signal extCLK, internal clock signal intCLKD as a trigger must be generated at least a data output delay time (To) ahead of the output timing.

Now, a configuration of the main portion of semiconductor memory device that includes a conventional internal clock signal generating circuit will be described with reference to FIG. 43. The conventional semiconductor memory device shown in FIG. 43 includes a minute delay stage 910, a phase comparator 930, a control circuit 950, an input buffer 2, an output buffer replica 4, an input buffer replica 6, and an output buffer 8.

Input buffer 2 takes in external clock signal extCLK and outputs a clock signal ORGCLK, which is applied to phase comparator 930 and to minute delay stage 910 as their input signals, respectively. Phase comparator 930 compares the phases of clock signal ORGCLK and of a feedback signal FBCLK output from input buffer replica 6 to determine which signal is advanced in phase.

Phase comparator 930 outputs a down signal ZDOWN that directs to increase the amount of delay to be provided (hereinafter, referred to as "delay amount"), or an up signal ZUP that directs to decrease the delay amount, so as to make these phases substantially synchronized with each other (to establish phase lock). When internal clock signal generating circuit is locked (phase-locked), phase comparator 930 outputs a lock signal ZLOCK at an "L" level.

Minute delay stage 910 includes a plurality of delay elements. Minute delay stage 910 uses that plurality of delay elements to minutely change the delay amount. Control circuit 950 includes a plurality of shift registers provided corresponding to the plurality of delay elements. The plurality of shift registers respond to the output of phase comparator 930 to output a control signal (R(0) to R(M−1) in FIG. 43).

Internal clock signal intCLKD output from minute delay stage 910 controls the output operation of output buffer 8. Internal clock signal intCLKD passes through output buffer replica 4 and input buffer replica 6, and is supplied to phase comparator 930 as feedback signal FBCLK. Output buffer replica 4 simulates delay (data output delay time T0) at output buffer 8. Input buffer replica 6 simulates delay (Ti) at input buffer 2.

For example, suppose that the phase of output data DQ must be delayed by one clock (Tc) relative to external clock signal extCLK. In this case, the delay amount in minute delay stage 910 is fine adjusted to give internal clock signal intCLKD a time delay of (Tc−T0) with respect to external clock signal extCLK. (Here, the signal that has passed through output buffer replica 4 is delayed by Tc relative to external clock signal extCLK. Further, the signal having passed through input buffer replica 6 is (Tc+Ti) behind external clock signal extCLK.)

In order to reduce jitter generated in the internal clock signal generating circuit, there is a need to change the delay amount in minute delay stage 910 still more minutely. For example, the above DDR-SDRAM requires a time resolution in unit of 0.1 ns. With the configuration of conventional internal clock signal generating circuit, however, there has been a problem that, as the time resolution is made finer to accommodate to a wider range of frequencies, the number of delay elements inevitably increases, and thus the layout area increases.

In the case where the cycle length Tc to achieve phase lock is 15 ns and data output delay time T0 is 2 ns, for example, it is necessary to realize the delay of (Tc−Ti−T0)= 11 ns. Here, if the time resolution in unit of 0.1 ns is required, at least 110 stages (=11 ns/0.1 ns) of delay elements are necessary, and consequently, the number of shift registers to be included in control circuit 950 increases.

If the signal to achieve phase lock is low in frequency, the number of delay elements will increase, which means that considerable amount of time will be required for establishment of phase lock.

Furthermore, as the operating power supply voltage of semiconductor memory device is lowered, there is a need for an internal clock signal generating circuit that can realize a desired delay even with such low voltage.

In addition, in view of the manufacturing cost of the semiconductor memory device per se, judgement on the quality of internal clock signal generating circuit must be performed simply as well as rapidly.

SUMMARY OF THE INVENTION

Accordingly, an object of the present invention is to provide an internal clock signal generating circuit that permits rapid establishment of phase lock and ensures a stable operation, with restricted layout area.

Another object of the present invention is to provide an internal clock signal generating circuit that can realize a desired delay even with a low power supply voltage.

An internal clock signal generating circuit according to an aspect of the present invention is for generating an internal clock signal synchronized in phase with an externally applied external clock signal, and includes: a phase difference detecting circuit for detecting a phase difference between the external clock signal and the internal clock signal; a first delay circuit for delaying the external clock signal for output, which is capable of changing the delay amount by a first time width dependent on the detected phase difference; and a second delay circuit for delaying an output of the first delay circuit for output as an internal clock signal, which is capable of changing the delay amount by a second time width that is larger than the first time width, dependent on the detected phase difference.

Accordingly, a primary advantage of the present invention is that a highly precise internal clock signal generating circuit with small layout area can be realized by utilizing a minute delay stage that can change the delay amount minutely and a delay stage that can change the delay amount by a relatively large amount.

Specifically, the internal clock signal as an object of the detection of phase difference is shifted according to a cycle length to achieve phase lock, whereby an initial lock-in time can be shortened. In addition, the second delay circuit gives a delay according to a cycle length of external clock signal, and thus, the initial lock-in time can further be shortened. After the lock is established, the selected state in the second delay circuit is held, which can suppress generation of jitter.

Further, the phase difference is detected by utilizing a cross-coupled circuit for determining which of the external clock signal or the internal clock signal has arrived earlier, and another cross-coupled circuit for determining which of the external clock signal or a signal obtained by minutely delaying the internal clock signal has arrived earlier. Accordingly, it becomes possible to detect a minute phase difference with a stable operation.

The delay amount is adjusted by using a MOS capacitor that effects capacitive coupling with a delay line directly dependent on the phase difference. Accordingly, a desired delay operation is ensured even with a low power supply voltage.

According to another aspect of the present invention, the internal clock signal generating circuit for generating an internal clock signal synchronized in phase with an externally applied external clock signal includes: a phase difference comparison circuit that has a detecting circuit for detecting a phase difference between the external clock signal and the internal clock signal, and a comparison control circuit for shifting the internal clock signal that is an object of the detection by the detecting circuit, dependent on a cycle length to achieve phase lock; and a delay circuit for delaying the external clock signal and outputting the internal clock signal, which circuit is capable of changing the delay amount dependent on the detected phase difference.

Accordingly, another advantage of the present invention is that an initial lock-in time can be shortened, by shifting the internal clock signal being an object of the detection of phase difference dependent on a cycle length to achieve phase lock.

According to yet another aspect of the present invention, the internal clock signal generating circuit for generating an internal clock signal synchronized in phase with an externally applied external clock signal includes: a phase difference detecting circuit for detecting a phase difference between the external clock signal and the internal clock signal; a delay circuit for causing the external clock signal to pass along and outputting the internal clock signal; and a variable capacitance circuit connected to the delay circuit and having therein a MOS transistor that effects capacitive coupling with the delay circuit dependent on the detected phase difference.

Accordingly, a still further advantage of the present invention is that a desired delay operation is ensured even with a low power supply voltage, because of the provision of the delay stage that is capable of adjusting the delay amount by employing a MOS capacitor that effects capacitive coupling with a delay line directly dependent on the phase difference.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a diagram illustrating the operation of a select signal generating circuit 28 shown in FIG. 4.

DESCRIPTION OF THE PREFERRED EMBODIMENTS

First Embodiment

Figure 1:
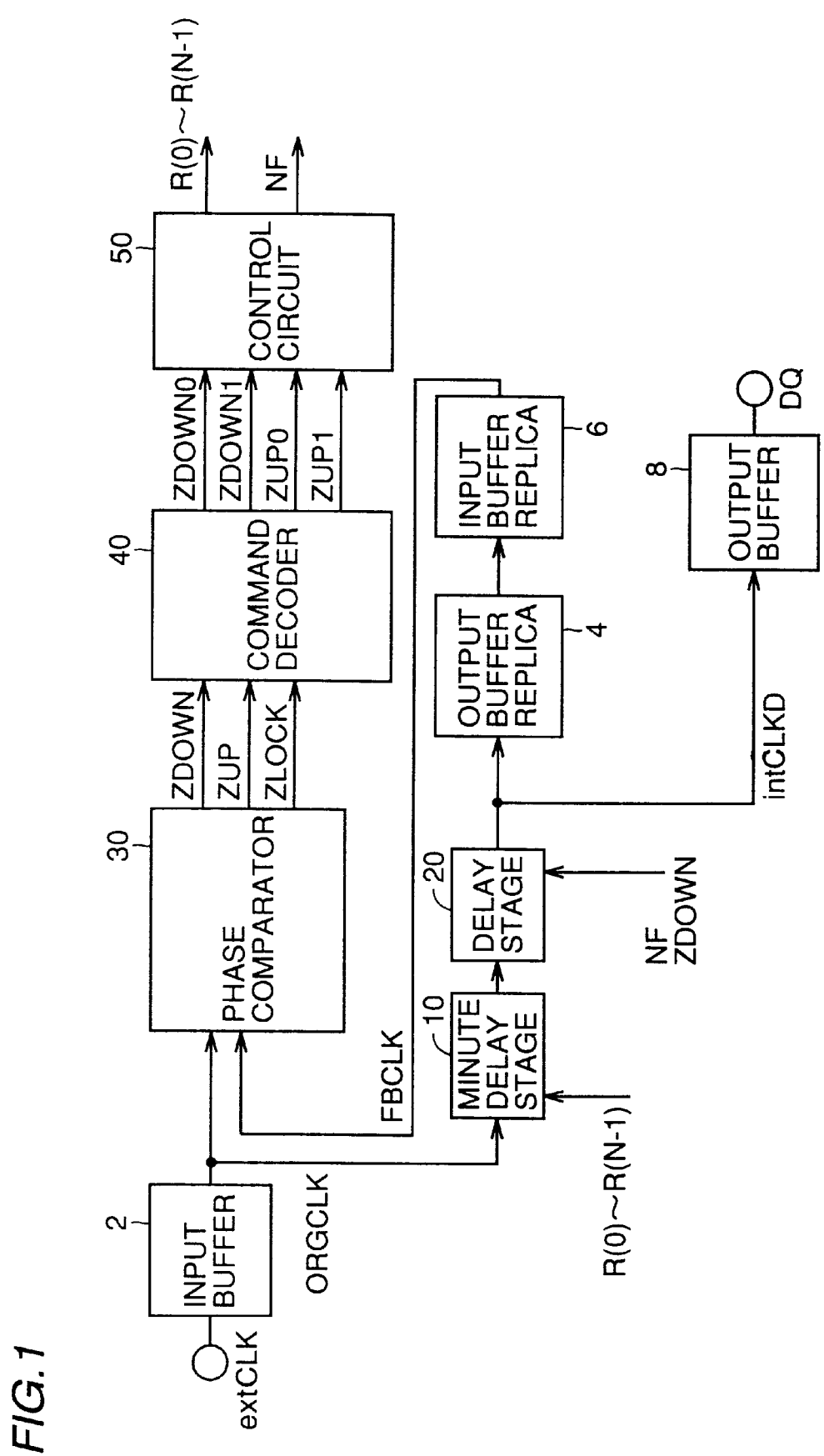
FIG. 1 is a diagram showing a configuration of the main portion of the semiconductor memory device including an internal clock signal generating circuit according to a first embodiment of the present invention.

A semiconductor memory device including an internal clock signal generating circuit according to the first embodiment of the present invention will be described with reference to FIG. 1. The semiconductor memory device shown in FIG. 1 includes an input buffer 2, a phase comparator 30, a command decoder 40, a control circuit 50, a minute delay stage 10, a delay stage 20, an of output buffer replica 4, an input buffer replica 6, and an output buffer 8.

Phase comparator 30 and minute delay stage 10 receive a clock signal ORGCLK output from input buffer 2. Phase comparator 30 compares the phases of clock signal ORGCLK and of a feedback signal FBCLK output from input buffer replica 6 and determine which signal is advanced in phase. In response to the result of determination, phase comparator 30 outputs a down signal ZDOWN or an up signal ZUP to make these phases substantially synchronize (to establish phase lock). When the phases are synchronized with each other, phase comparator 30 outputs a lock signal ZLOCK.

Down signal ZDOWN at an L level is an instruction to increase the delay amount because the delay is insufficient. Up signal ZUP at an L level is an instruction to decrease the delay amount. Lock signal ZLOCK at an L level is a signal meaning that the internal clock signal generating circuit is in a locked state and a desired delay has been attained.

Command decoder 40 decodes the signal received from phase comparator 30 and outputs a signal ZDOWN0, ZDOWN1, ZUP0 or ZUP1.

The operation of command decoder 40 will now be described in brief. Command decoder 40 outputs down signal ZDOWN0 after reset. It outputs up signal ZUP1 or down signal ZDOWN1 following up signal ZUP0 or down signal ZDOWN0, and outputs up signal ZUP0 or down signal ZDOWN0 following up signal ZUP1 or down signal ZDOWN1. For example, output of up signal ZUP1 is followed by output of up signal ZUP0 or down signal ZDOWN0. The locked state is released in the case where the up signal or the down signal is generated twice in a row, after lock signal ZLOCK at the L level is generated.

Control circuit 50, which includes a plurality of shift registers, responds to the output of command decoder 40 and outputs control signals (R(0) to R(N−1) in FIG. 1) and a signal NF. Control circuit 50 controls the delay amount in minute delay stage 10 and in delay stage 20, respectively.

Now, the operation of control circuit 50 will be described. When down signals ZDOWN0 and ZDOWN1 are alternately activated, in response, values in the shift registers are shifted bit by bit from LSB side (R(0)) to MSB side (R(N−1)). That is, control signals R(0) to R(N−1) are sequentially activated in one direction.

$$(R(0), \ldots, R(N-1)) \to (0, 0, \ldots, 0) \tag{1}$$

$$\to (1, 0, \ldots, 0) \tag{2}$$

$$\to (1, 1, \ldots, 0) \tag{3}$$

When up signals ZUP0 and ZUP1 are activated alternately, values of the shift registers are shifted bit by bit from MSB side to LSB side. That is, control signals R(0) to R(N−1) are sequentially inactivated in the other direction.

$$(R(0), \ldots, R(N-1)) \to (1, \ldots, 1, 1) \tag{4}$$

$$\to (1, \ldots, 1, 0) \tag{5}$$

$$\to (1, \ldots, 0, 0) \tag{6}$$

Signal NF is a signal for recognizing that the plurality of shift registers included in control circuit 50 are fully utilized. Specifically, signal NF takes a value of a register located near MSB side.

Minute delay stage 10 delays clock signal ORGCLK. The delay amount in minute delay stage 10 is changed minutely in response to the control signal received from control circuit 50. Delay stage 20 delays the output of minute delay stage 10. The delay amount in delay stage 20 is changed according to signal NF and down signal ZDOWN. The delay amount in delay stage 20 is altered in a larger amount than in minute delay stage 10.

Internal clock signal intCLKD output from delay stage 20 controls output operation of output buffer 8. Internal clock signal intCLKD is supplied as feedback signal FBCLK to phase comparator 30 via output buffer replica 4 and input buffer replica 6.

Figure 2:
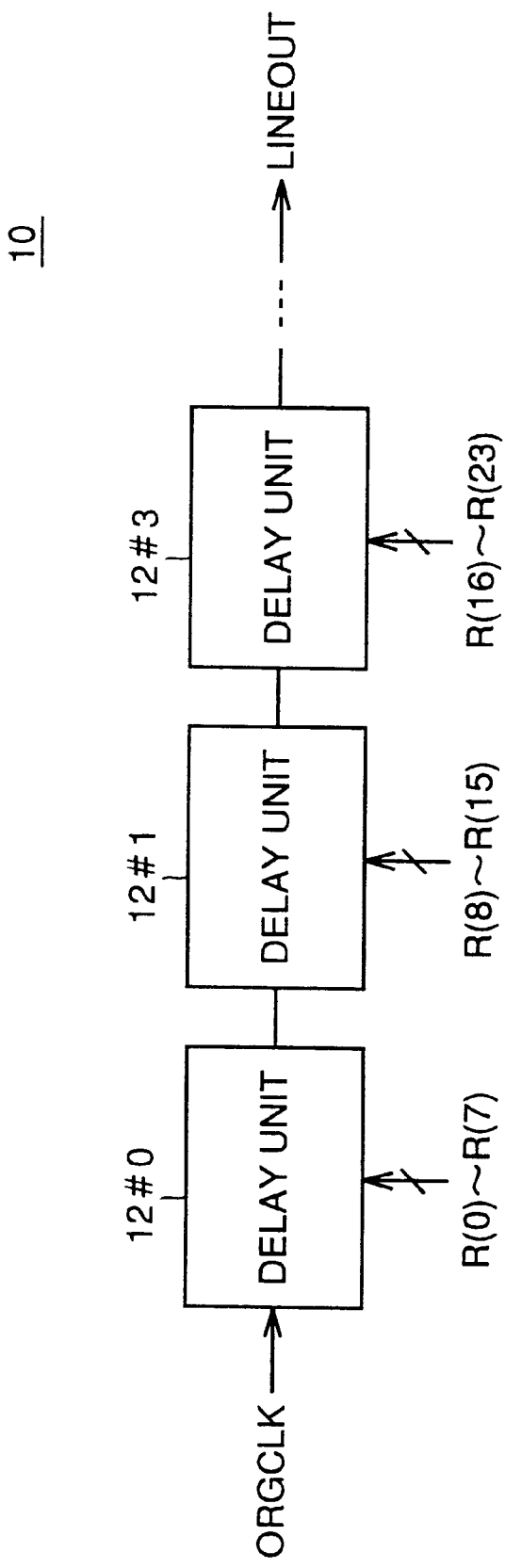
FIG. 2 is a block diagram showing a configuration of a minute delay stage 10 shown in FIG. 1.

Here, the configuration of minute delay stage 10 will be described with reference to FIG. 2. Minute delay stage 10 includes a plurality of delay units. Shown in FIG. 2 are representative delay units 12#0, 12#1 and 12#3. Reference characters R(0) to R(7), R(8) to R(15), and R(16) to R(23) represent control signals received from control circuit 50.

Delay units 12#0, . . . are connected in series. Delay unit 12#0 receives clock signal ORGCLK. A clock signal LINEOUT is output from the delay unit in the last stage. The delay amount in each delay unit is adjusted based on the corresponding control signals: i.e., in delay unit 12#0 by control signals R(0) to R(7); in delay unit 12#1 by control signals R(8) to R(15); and in delay unit 12#3 by control signals R(16) to R(23).

Now, an example of a specific configuration of each delay unit will be described with reference to FIG. 3. The delay unit shown in FIG. 3 (designated as "12") includes an inverter I1, NMOS transistors N1#0 to N1#7, and capacitors C1#0 to C1#7.

Inverter I1 is connected to an input node IN. On a signal line L1 coupling an output node of inverter I1 and an output node OUT of delay unit 12, NMOS transistors N1#0 to N1#7 are connected in this order with one of their conduction terminals, respectively. (In FIG. 3, reference characters a0 to a7 represent connection nodes between respective NMOS transistors N1#0 to N1#7 and signal line L1.)

Respective capacitors C1#0 to C1#7 are connected between the other conduction terminals of corresponding NMOS transistors N1#0 to N1#7 and ground potentials, respectively. Respective NMOS transistors N1#0 to N1#7 are turned ON/OFF in response to the signals at control terminals CTRL(0) to CTRL(7), respectively.

Control terminals CTRL(0) to CTRL(7) in delay unit 12#0 receive control signals R(0) to R(7), control terminals CTRL(0) to CTRL(7) in delay unit 12#1 receive control signals R(8) to R(15), and control terminals CTRL(0) to CTRL(7) in delay unit 12#3 receive control signals R(16) to R(23), respectively.

When respective NMOS transistors N1#0 to N1#7 are turned ON, corresponding nodes a0 to a7 are electrically connected to corresponding capacitors C1#0 to C1#7. Accordingly, the capacity at each node a0 to a7 is changed. For example, when NMOS transistor N1#0 is turned ON, the potential of the signal at node a0 makes a moderate transition corresponding to a value determined by the capacity of capacitor C1#0. The delay amount in delay unit 12 is thus fine adjusted.

Figure 4:
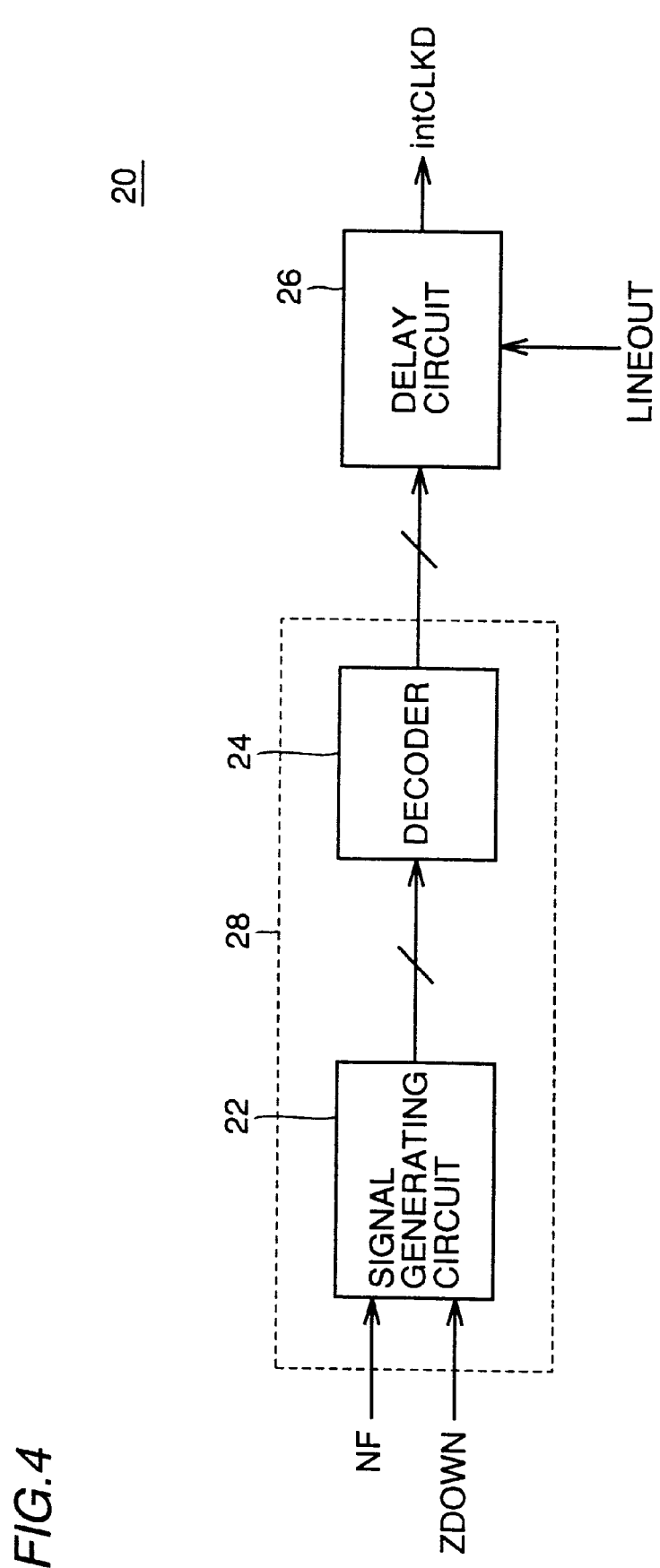
FIG. 4 is a block diagram showing a configuration of a delay stage 20 shown in FIG. 1.

Now, a configuration of delay stage 20 shown in FIG. 1 will be described with reference to FIG. 4. Referring to FIG. 4, delay stage 20 includes a delay circuit 26 having a plurality of fixed delay circuits and a select signal generating circuit 28. Select signal generating circuit 28 includes a signal generating circuit 22 and a decoder 24.

Select signal generating circuit 28 generates a select signal in response to signal NF and down signal ZDOWN. Based on the select signal output from select signal generating circuit 28, one signal delayed by the fixed delay circuits, which will be described later, is output as internal clock signal intCLKD.

Figure 5:
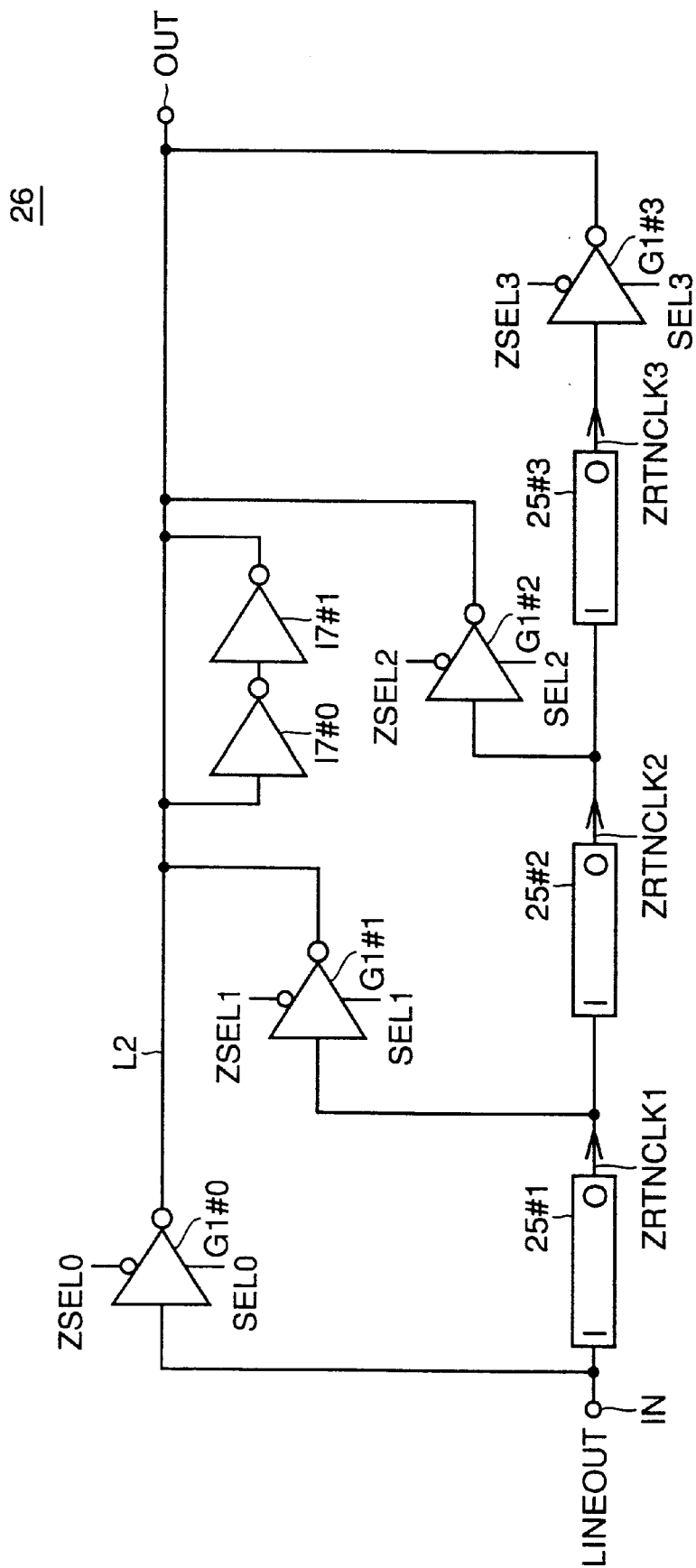
FIG. 5 is a circuit diagram showing an example of a specific configuration of a delay circuit 26 shown in FIG. 4.

A specific configuration of delay circuit 26 shown in FIG. 4 will be described by way of example with reference to FIG. 5. Referring to FIG. 5, delay circuit 26 includes gate circuits G1#0 to G1#3, inverters I7#0 and I7#1, and fixed delay circuits 25#1 to 25#3.

A respective fixed delay circuit 25#1 to 25#3 delays the input signal by a prescribed period of time and outputs the resulting signal. The delay amount in each fixed delay circuit is 3 ns, for example, which is larger than the delay amount in minute delay stage 10.

Gate circuit G1#0, which responds to select signals SEL0 and ZSEL0, inverts signal LINEOUT received at input node IN and outputs the inverted signal on a signal line L2. Signal line L2 is connected to an output node OUT, from which node internal clock signal intCLKD is output.

Fixed delay circuits 25#1 to 25#3 are connected in series. Fixed delay circuit 25#1 delays the signal at input node IN and outputs a signal ZRTNCLK1. Gate circuit G1#1 inverts signal ZRTNCLK1 in response to select signals SEL1 and ZSEL1, and outputs the inverted signal on signal line L2.

Fixed delay circuit 25#2 delays signal ZRTNCLK1 and outputs a signal ZRTNCLK2. Gate circuit G1#2 inverts signal ZRTNCLK2 in response to select signals SEL2 and ZSEL2, and outputs the inverted signal on signal line L2.

Fixed delay circuit 25#3 delays signal ZRTNCLK2 and outputs a signal ZRTNCLK3. Gate circuit G1#3 inverts signal ZRTNCLK3 in response to select signals SEL3 and ZSEL3, and outputs the inverted signal on signal line L2.

Inverters I7#0 and I7#1 are serially connected between the output nodes of respective gate circuits G1#1 and G1#2.

When only select signal SEL0 is at an H level (and select signals SEL1 to SEL3 are at an L level), signal LINEOUT is selected as it is, and transmitted to output node OUT. If select signal SEL3 is at an H level, signal ZRTNCLK3 is selected and transmitted to output node OUT. In this case, signal LINEOUT is delayed by 9 ns.

Figure 6:
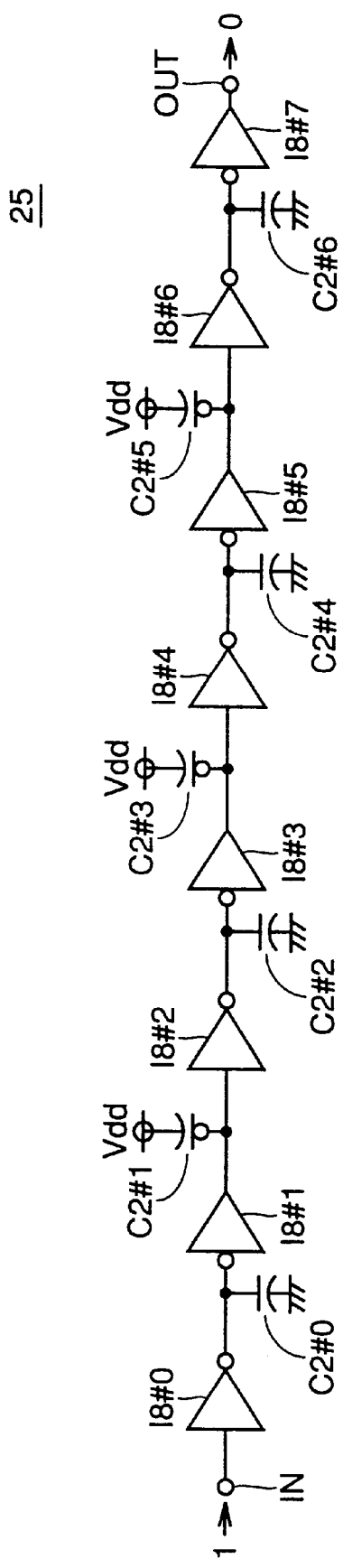
FIG. 6 is a circuit diagram showing an example of a specific configuration of a fixed delay circuit shown in FIG. 5.

Here, an example of a circuit configuration of fixed delay circuits 25#1 to 25#3 shown in FIG. 5 will be described with reference to FIG. 6. The fixed delay circuit shown in FIG. 6 (designated as "25") includes inverters I8#0 to I8#7, and capacitors C2#0 to C2#6.

Inverters I8#0 to I8#7 are serially connected between input node IN and output node OUT. One electrode of a respective capacitor C2#0 to C2#6 is connected to an output node of a respective inverter I8#0 to I8#6. The other electrode of each capacitor C2#0, C2#2, C2#4 and C2#6 is connected to a ground potential, respectively. The other electrode of each capacitor C2#1, C2#3 and C2#5 is connected to a power supply potential Vdd, respectively.

The potentials of output signals of respective inverters I8#0 to I8#6 make moderate transitions according to values determined by the capacity of respective capacitors C2#0 to C2#6 corresponding thereto. Accordingly, the signal input to fixed delay circuit 25 is delayed by a prescribed period of time for output.

Figure 7:
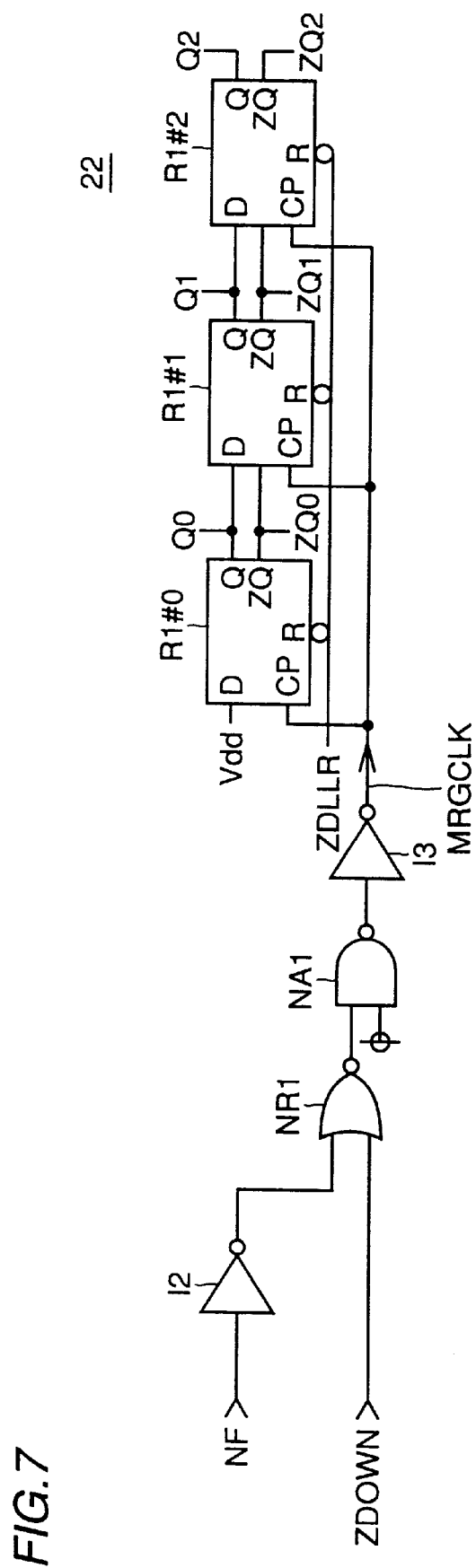
FIG. 7 is a diagram showing an example of a specific configuration of a signal generating circuit 22 shown in FIG. 4.

Now, select signal generating circuit 28 shown in FIG. 4 will be described with reference to FIGS. 7 to 10. FIG. 7 shows an example of a specific configuration of signal generating circuit 22 shown in FIG. 4. Referring to FIG. 7, signal generating circuit 22 includes inverters I2 and I3, an NOR circuit NR1, an NAND circuit NA1, and shift registers R1#0 to R1#2.

Inverter I2 inverts signal NF. NOR circuit NR1 receives at its inputs an output of inverter I2 and down signal ZDOWN. NAND circuit NA1 has one input terminal receiving an output of NOR circuit NR1 and the other input terminal connected to a power supply potential. Inverter I3 inverts an output of NAND circuit NA1 and outputs a clock signal MRGCLK.

When signal NF attains an H level and down signal ZDOWN attains an L level, clock signal MRGCLK attains an H level. That is, when the delay amount in the minute delay stage reaches an approximately maximum level and yet the delay is still insufficient, clock signal MRGCLK is generated.

Shift registers R1#0 to R1#2 respond to the signals received from D and CP terminals, and output respective signals from Q and ZQ terminals. Shift register R1#0 outputs signals Q0 and ZQ0 from its Q and ZQ terminals, respectively. Shift register R1#1 outputs signals Q1 and ZQ1 from its Q and ZQ terminals, respectively. Shift register R1#2 outputs signals Q2 and ZQ2 from its Q and ZQ terminals, respectively.

CP terminals of respective shift registers R1#0 to R1#2 each receive clock signal MRGCLK. D terminals of shift registers R1#0, R1#1 and R1#2 receive, respectively, power supply potential Vdd, signal Q0, and signal Q1. R terminals of respective shift registers R1#0 to R1#2 each receive a reset signal ZDLLR that resets the internal clock signal generating circuit.

Figure 8:
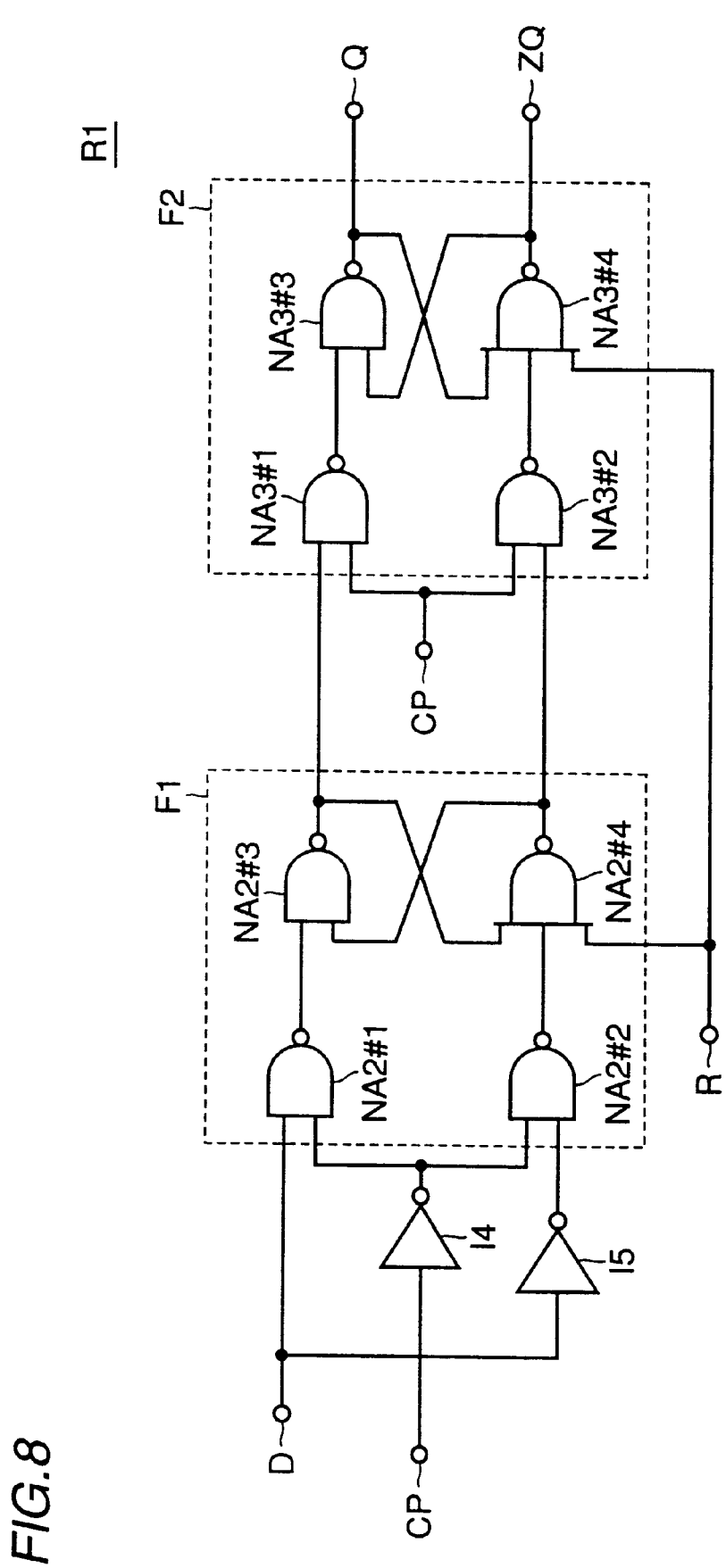
FIG. 8 is a circuit diagram showing an example of a specific configuration of shift registers R1#0 to R1#2 shown in FIG. 7.
Figure 9A:
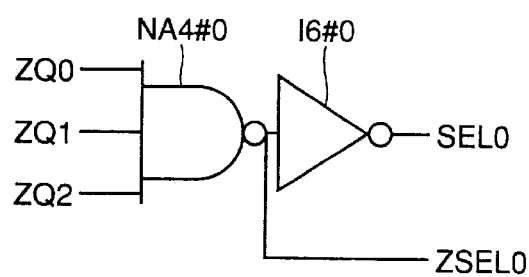
FIGS. 9A–9D are circuit diagrams showing an example of a specific configuration of a decoder 24 shown in FIG. 4.
Figure 9B:
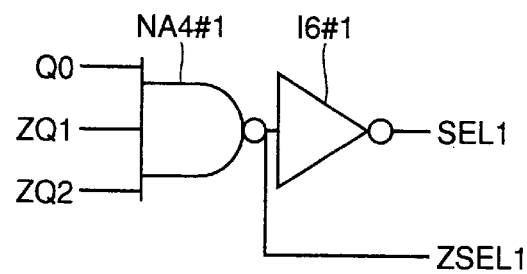
Figure 9C:
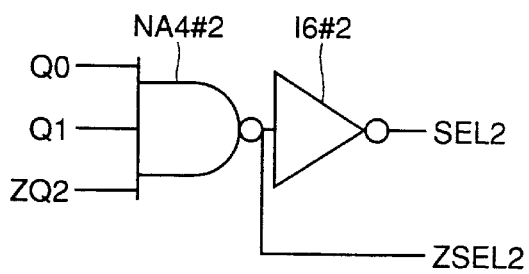
Figure 9D:
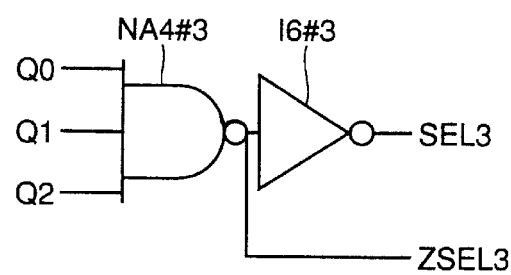

Here, an example of a specific configuration of a respective shift register R1#0 to R1#2 will be described with reference to FIG. 8. Referring to FIG. 8, the shift register (designated as "R1") includes inverters I4 and I5, and flip flop circuits F1 and F2. Inverter 14 inverts the signal received at CP terminal. Inverter 15 inverts the signal received at D terminal.

Flip flop circuit F1 includes NAND circuits NA2#1 and NA2#2, and cross-coupled NAND circuits NA2#3 and NA2#4. NAND circuit NA2#1 receives the signal at D terminal and an output of inverter I4. NAND circuit NA2#2 receives outputs from respective inverters I4 and I5. NAND circuit NA2#3 receives outputs of respective NAND circuits NA2#1 and NA2#4. NAND circuit NA2#4 receives outputs of respective NAND circuits NA2#2 and NA2#3 as well as the signal at R terminal.

Flip flop circuit F2 includes NAND circuits NA3#1 and NA3#2, and cross-coupled NAND circuits NA3#3 and NA3#4. NAND circuit NA3#1 receives an output of NAND circuit NA2#3 and the signal at CP terminal. NAND circuit NA3#2 receives an output of NAND circuit NA2#4 and the signal at CP terminal. NAND circuit NA3#3 receives outputs from respective NAND circuits NA3#1 and NA3#4. The output node of NAND circuit NA3#3 is connected to Q terminal. NAND circuit NA3#4 receives outputs of respective NAND circuits NA3#2 and NA3#3 as well as the signal at R terminal. The output node of NAND circuit NA3#4 is connected to ZQ terminal.

Flip flop circuit F1 is set according to the signal at CP terminal. The state of flip flop circuit F2 alters according to the state of flip flop circuit F1 being the preceding stage, when the signal at CP terminal attains an H level.

Now, an exemplary configuration of the decoder 24 shown in FIG. 4 will be described with reference to FIGS. 9a to 9d. The circuit shown in FIG. 9a includes an NAND circuit NA4#0 and an inverter I6#0. The circuit shown in FIG. 9b includes an NAND circuit NA4#1 and an inverter I6#1. The circuit shown in FIG. 9c includes an NAND circuit NA4#2 and an inverter I6#2. And the circuit shown in FIG. 9d includes an NAND circuit NA4#3 and an inverter I6#3.

NAND circuit NA4#0 receives signals ZQ0, ZQ1 and ZQ2, and outputs a select signal ZSEL0. NAND circuit NA4#1 receives signals Q0, ZQ1 and ZQ2, and outputs a select signal ZSEL1. NAND circuit NA4#2 receives signals Q0, Q1 and ZQ2, and outputs a select signal ZSEL2. NAND circuit NA4#3 receives signals Q0, Q1 and Q2, and outputs a select signal ZSEL3.

Inverter I6#0 inverts select signal ZSEL0 and outputs select signal SEL0. Inverter I6#1 inverts select signal ZSEL1 and outputs select signal SEL1. Inverter I6#2 inverts select signal ZSEL2 and outputs select signal SEL2. And inverter I6#3 inverts select signal ZSEL3 and outputs select signal SEL3.

FIG. 10 is a diagram illustrating the operation of select signal generating circuit 28 shown in FIG. 4. More specifically, it shows a relation between select signals SEL0 to SEL3 and signals Q0 to Q2. Referring to FIG. 10, output values of shift registers R1#0 to R1#2 are shifted bit by bit. Correspondingly, select signals SEL0, SEL1, SEL2 and SEL3 are activated one at a time in this order.

Thus, one signal having passed the fixed delay circuits (or an output of minute delay stage 10) is selectively output as internal clock signal intCLKD.

Figure 11:
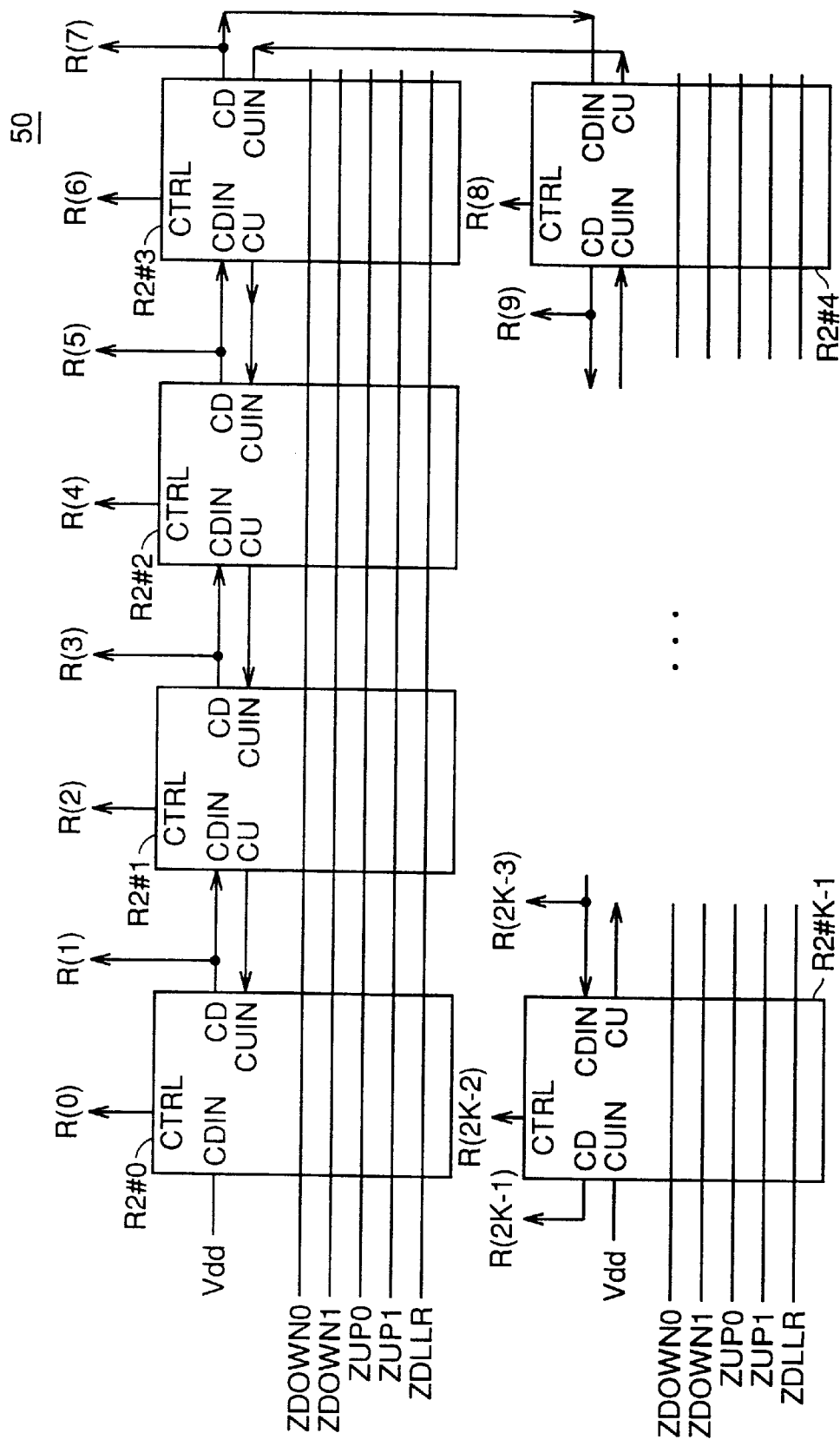
FIG. 11 is a block diagram showing a configuration of a control circuit 50 shown in FIG. 1.

Now, a configuration of control circuit 50 shown in FIG. 1 will be described with reference to FIG. 11. As shown in FIG. 11, control circuit 50 includes a plurality of shift registers. FIG. 11 shows representatively a plurality of shift registers R2#0, R2#1, R2#2, R2#3, R2#4, and R2#K−1.

Shift registers R2#0, . . . are serially connected to one another. Each shift register has a CDIN terminal that is connected to a CD terminal of the shift register in its preceding stage, and a CUIN terminal that is connected to a CU terminal of the shift register in its succeeding stage. CDIN terminal of shift register R2#0 of the first stage is connected to power supply potential Vdd, and CUIN terminal of shift register R2#K−1 of the last stage is connected to power supply potential Vdd.

A control signal $R(2 \times i)$ (i=0, . . . , K−1) is output from a CTRL terminal of a respective shift register R2#i, and a control signal $R(2 \times i+1)$ is output from its CD terminal.

Now, an example of a specific configuration of a respective shift register R2#0, . . . will be described with reference to FIG. 12.

Figure 12:
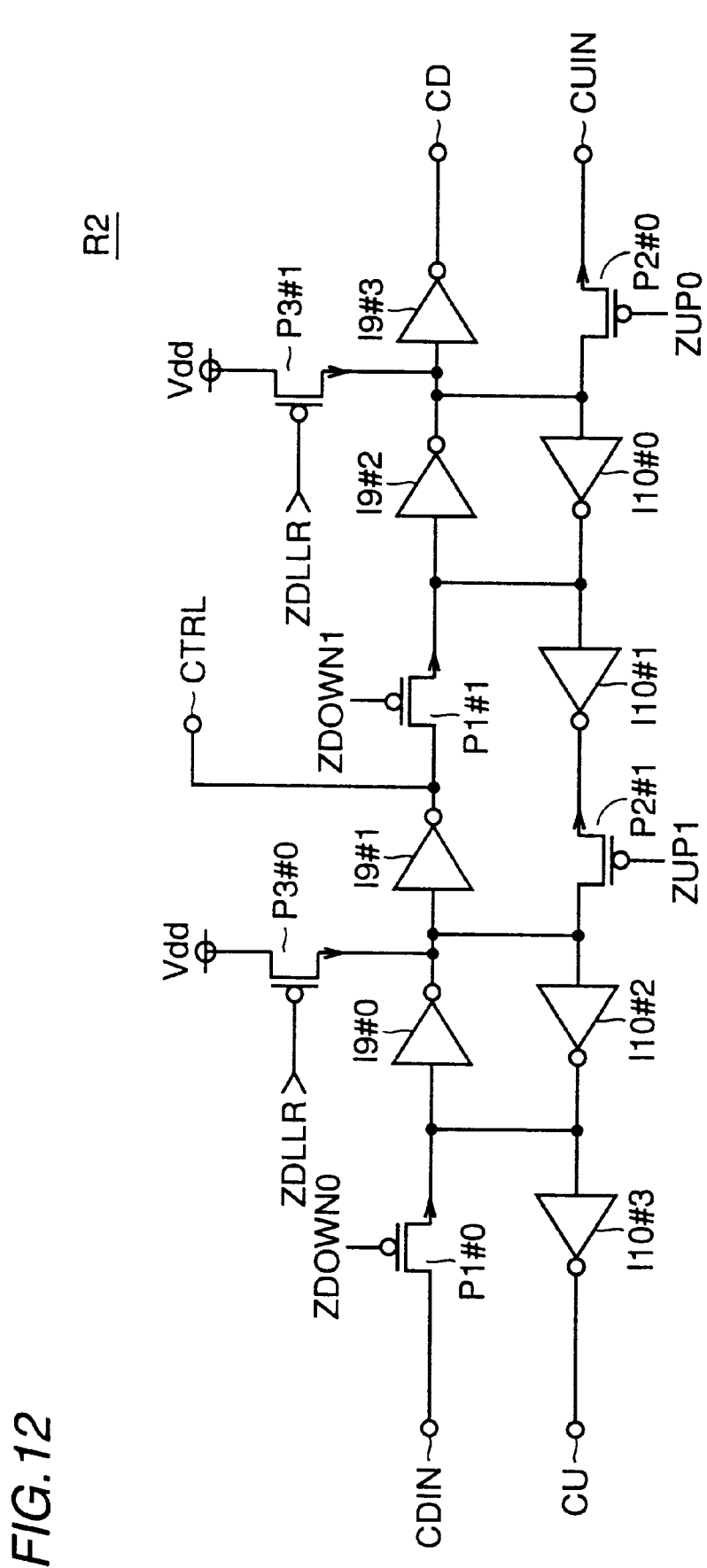
FIG. 12 is a circuit diagram showing an example of a specific configuration of a shift register shown in FIG. 11.

The shift register shown in FIG. 12 (designated as "R2") includes PMOS transistors P1#0, P1#1, P2#0, P2#1, P3#0 and P3#1, and inverters I9#0 to I9#3 and I10#0 to I10#3.

Gate electrodes of PMOS transistors P3#0 and P3#1 each receive reset signal ZDLLR, respectively. Gate electrodes of PMOS transistors P1#0 and P1#1 receive down signals ZDOWN0 and ZDOWN1, respectively. Gate electrodes of PMOS transistors P2#1 and P2#0 receive up signals ZUP1 and ZUP0, respectively.

PMOS transistor P2#0 is connected between CUIN terminal and inverter I10#0. Inverter I10#1 is connected with inverter I10#0. PMOS transistor P2#1 is connected between inverter I10#1 and inverter I10#2. Inverter I10#3 is connected between CU terminal and inverter I10#2.

PMOS transistor P1#0 is connected between CDIN terminal and inverter I9#0. Inverter I9#1 is connected with inverter I9#0. PMOS transistor P1#1 is connected between inverters I9#1 and I9#2. Inverter I9#3 is connected between CD terminal and inverter I9#2.

Inverters I9#0 and I10#2 constitute a latch circuit. Inverters I9#2 and I10#0 constitute another latch circuit.

Control signals are output from CTRL terminal being a connection node of PMOS transistor P1#1 and inverter I9#1, and from CD terminal, respectively.

When down signal ZDOWN0 falls to an L level, PMOS transistor P1#0 is turned ON, and the signal at CD terminal of the shift register located in the preceding stage is latched at the latch circuit (of inverters I9#0 and I10#2). The potential of CTRL terminal changes according to the signal at CD terminal of the shift register in the preceding stage.

When down signal ZDOWN1 falls to an L level, CD terminal outputs a signal at the same level as that of CTRL terminal.

When up signal ZUP0 falls to an L level, PMOS transistor P2#0 is turned ON, and the signal at CU terminal of the shift register located in the succeeding stage is latched at the latch circuit (of inverters I9#2 and I10#0). When up signal ZUP1 attains an L level, CTRL terminal outputs an inverted signal of the signal at CUIN terminal.

By implementing the above-described configuration, the control signals all attain an L level when reset signal ZDLLR is input, and every time a down signal is applied, output values (R(0), R(1), . . . ) of shift registers are shifted bit by bit in the direction from LSB side to MSB side.

Now, the operation of the internal clock signal generating circuit according to the first embodiment of the present invention will be described with reference to FIGS. 1 to 12. Referring to FIGS. 1 to 12, when reset signal ZDLLR attains an L level (immediately after reset), signals Q0, Q1 and Q2 all attain an L level, select signal SEL0 attains an H level, and select signals SEL1 to SEL3 attain an L level. In this case, delay stage 20 (selectively) outputs the output signal of minute delay stage 10 as it is. The delay amount in minute delay stage 10 is fine adjusted according to the control signals.

If a further delay is determined to be necessary (down signal ZDOWN attains the L level) while control signals R(0), . . . are almost all at the H level, signal Q0 attains the H level, and select signal SEL1 attains the H level. Signal ZRTNCLK1 having passed through fixed delay circuit 25#1 is then selectively output from delay stage 20. In this case, the output of minute delay stage 10 is delayed by approximately 3 ns.

The signal output from delay stage 20 is supplied to phase comparator 30 via output buffer replica 4 and input buffer replica 6. If down signal ZDOWN is not output as a result of phase comparison at this time, the selected states of respective fixed delay circuits in delay stage 20 are maintained.

If feedback signal FBCLK is behind clock signal ORGCLK, up signal ZUP is generated. The capacitive coupling in minute delay stage 10 is thus altered to minutely decrease the delay amount therein, to accomplish phase lock. When clock signal ORGCLK and feedback signal FBCLK are synchronized at their rising edges with a prescribed delay amount, a lock signal ZLOCK is output and the operation is terminated.

If a determination is made to add further delay, signal Q1 attains an H level, and select signal SEL2 attains an H level. Signal ZRTNCLK2 having passed through fixed delay circuits 25#1 and 25#2 is selectively output from delay stage 20. In this case, the output of minute delay stage 10 is delayed by approximately 2×3 ns.

If a still further delay is determined to be necessary, signal Q2 attains an H level, and select signal SEL3 attains an H level. Signal ZRTNCLK3 having passed through fixed delay circuit 25#1 to 25#3 is selectively output from delay stage 20. In this case, the output of minute delay stage 10 is delayed by approximately 3×3 ns.

For example, suppose that the delay time T0 at output buffer 8 and at output buffer replica 4 is 2 ns each, and delay time Ti at input buffer 2 and at input buffer replica 6 is 2 ns each. Further, suppose that cycle length Tc to achieve phase lock is 15 ns, and the fixed delay time of a respective fixed delay circuit 25#1 to 25#3 is 3 ns each.

In this case, minute delay stage 10 only has to realize a delay of (Tc−Ti−T0−3×3 ns)=2 ns. That is, if the delay resolution of each delay element is 0.1 ns, it is possible to realize the desired delay with 20 stages (=2/0.1) of delay elements. Correspondingly, the number of shift registers to be included in control circuit 50 can also be reduced.

As explained above, the internal clock signal generating circuit according to the first embodiment of the present invention is provided not only with a first delay stage capable of minutely changing its delay amount but also with a second delay stage capable of changing its delay amount by an amount larger than in the first delay stage, so that the second delay stage can be utilized for delay when necessary. Accordingly, it is possible to provide a highly precise internal clock signal generating circuit occupying a very small area.

Second Embodiment

A semiconductor memory device including an internal clock signal generating circuit according to the second embodiment of the present invention will now be described with reference to FIG. 13. Hereinafter, the same components as in the circuit according to the first embodiment will be designated by the same reference characters and description thereof will not be repeated.

In the internal clock signal generating circuit according to the first embodiment, the fixed delay circuits have been employed to reduce layout area. With the configuration as in the first embodiment, however, the instruction to add the fixed delay may be output undesirably after the internal clock signal generating circuit has attained a locked state. Thus, a configuration for preventing such a large jitter (3 ns) due to the fixed delay circuits after the locking of the internal clock signal generating circuit will now be described.

Figure 13:
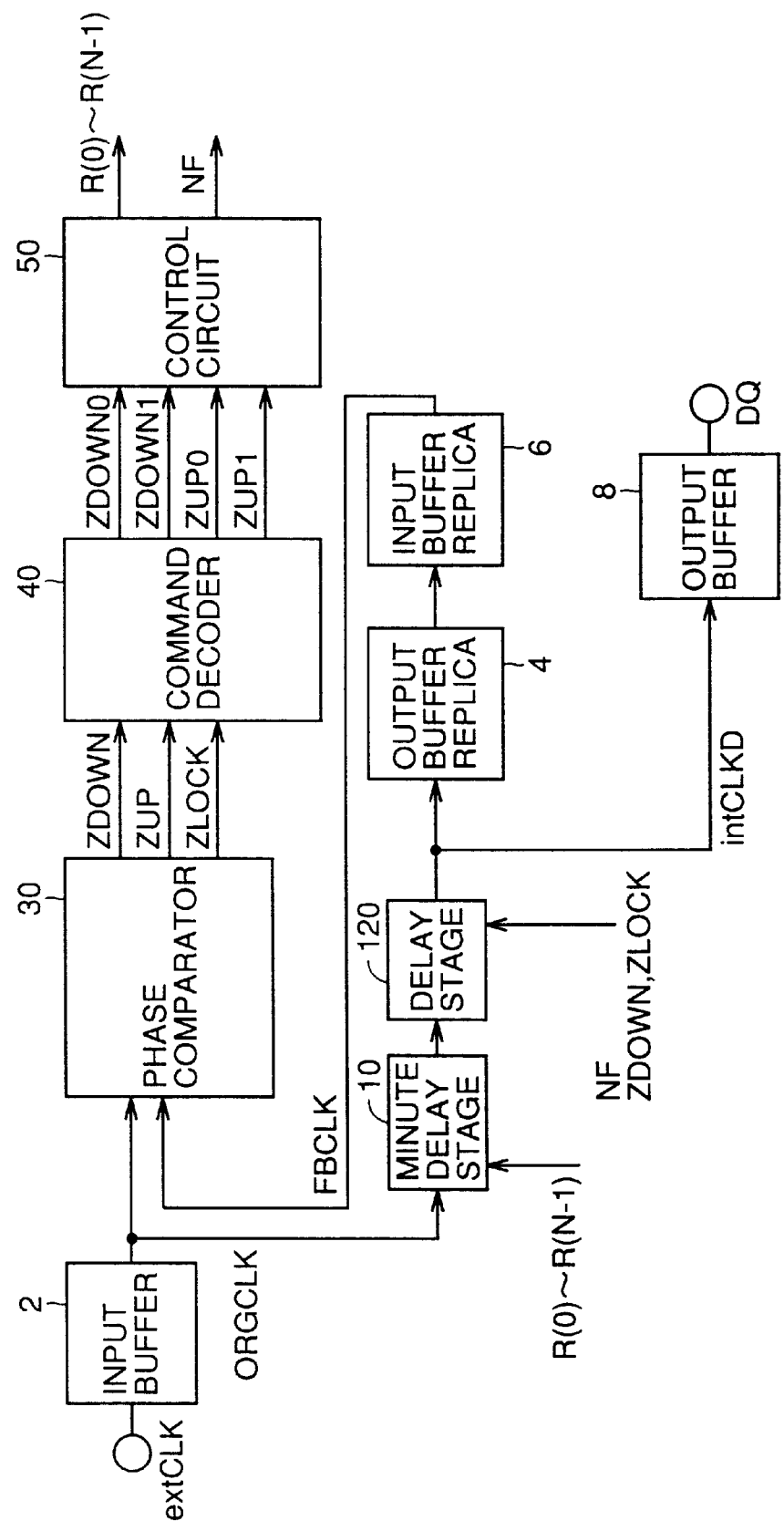
FIG. 13 is a block diagram showing a configuration of the main portion of the semiconductor memory device including the internal clock signal generating circuit according to a second embodiment of the present invention.

The internal clock signal generating circuit according to the second embodiment of the present invention prevents generation of jitter by accommodating a delay stage 120, as shown in FIG. 13, instead of delay stage 20 of the first embodiment.

Figure 14:
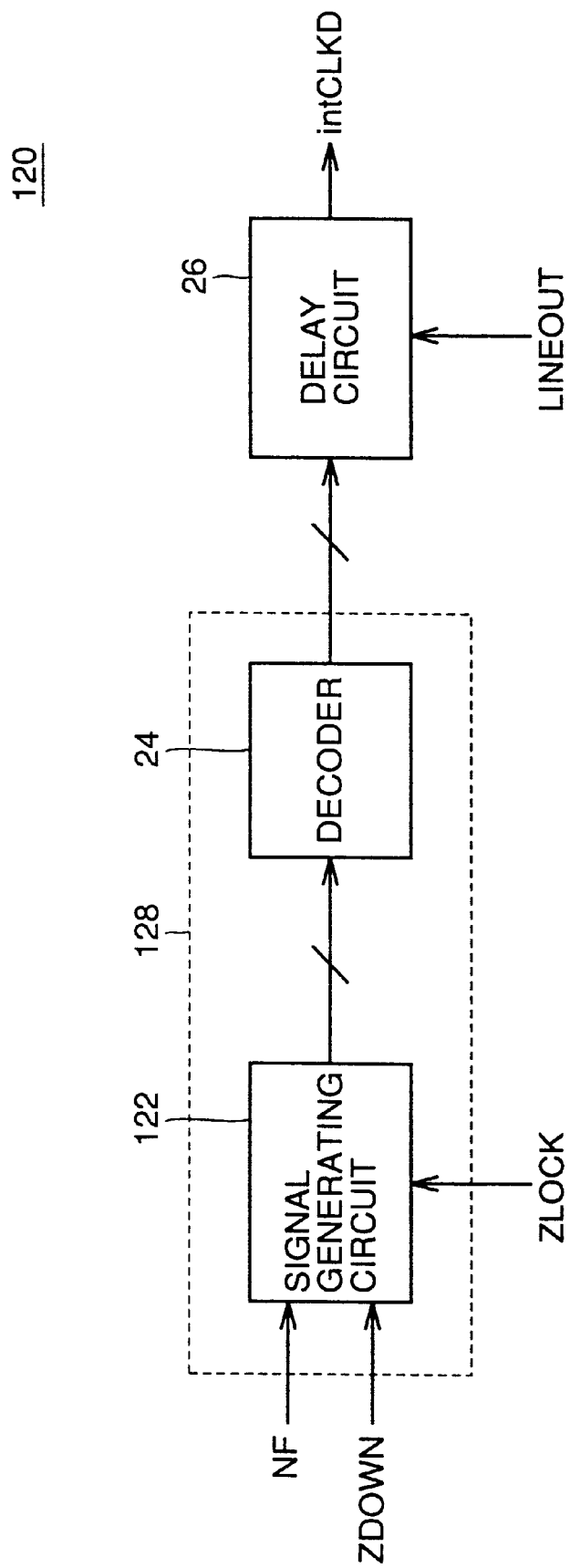
FIG. 14 is a block diagram showing a configuration of the main portion of a delay stage 120 shown in FIG. 13.

The configuration of delay stage 120 shown in FIG. 13 will be described with reference to FIG. 14. Referring to FIG. 14, delay stage 120 includes a delay circuit 26 having a plurality of fixed delay circuits therein and a select signal generating circuit 128. Select signal generating circuit 128 includes a signal generating circuit 122 and a decoder 24.

Figure 15:
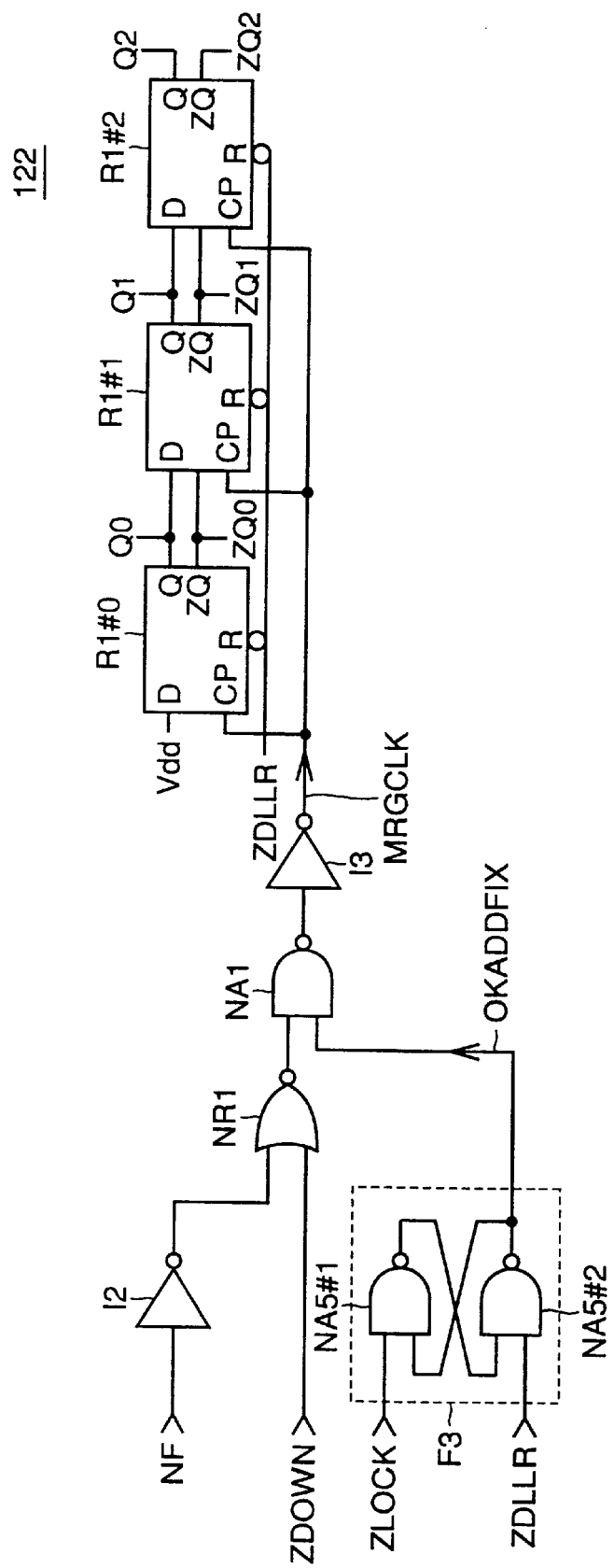
FIG. 15 is a diagram showing an example of a specific configuration of a signal generating circuit 122 shown in FIG. 14.

An exemplary configuration of signal generating circuit 122 shown in FIG. 14 will be described with reference to FIG. 15. Referring to FIG. 15, signal generating circuit 122 includes inverters I2 and I3, an NOR circuit NR1, an NAND circuit NA1, and shift registers R1#0 to R1#2. The connection relation among these components is as described above with reference to signal generating circuit 22 of the first embodiment. NAND circuit NA1 receives an output of NOR circuit NR1 and a signal OKADDFIX that will be described later.

Signal generating circuit 122 further includes a flip flop circuit F3. Flip flop circuit F3 includes cross-coupled NAND circuits NA5#1 and NA5#2. NAND circuit NA5#1 receives lock signal ZLOCK and output signal OKADDFIX of NAND circuit NA5#2. NAND circuit NA5#2 receives an output of NAND circuit NA5#1 and reset signal ZDLLR.

When the internal clock signal generating circuit is locked (i.e., after lock signal ZLOCK falls to an L level), signal OKADDFIX attains an L level. Correspondingly, clock signal MRGLCK output from inverter I3 attains an L level, and shift registers R1#0 to R1#2 terminate their operations.

The values of select signals SEL0 to SEL3, and ZSEL0 to ZSEL3 are thus maintained, and therefore, the selected states of respective fixed delay circuits in delay circuit 26 are maintained. As a result, a large jitter due to the addition of the fixed delay circuits can be prevented from generating after the internal clock signal generating circuit has been locked.

Third Embodiment

A semiconductor memory device including an internal clock signal generating circuit according to the third embodiment of the present invention will be described with reference to FIG. 16. The same components as in the circuit shown in FIG. 1 will be designated by the same reference characters, and description thereof is not repeated.

Figure 16:
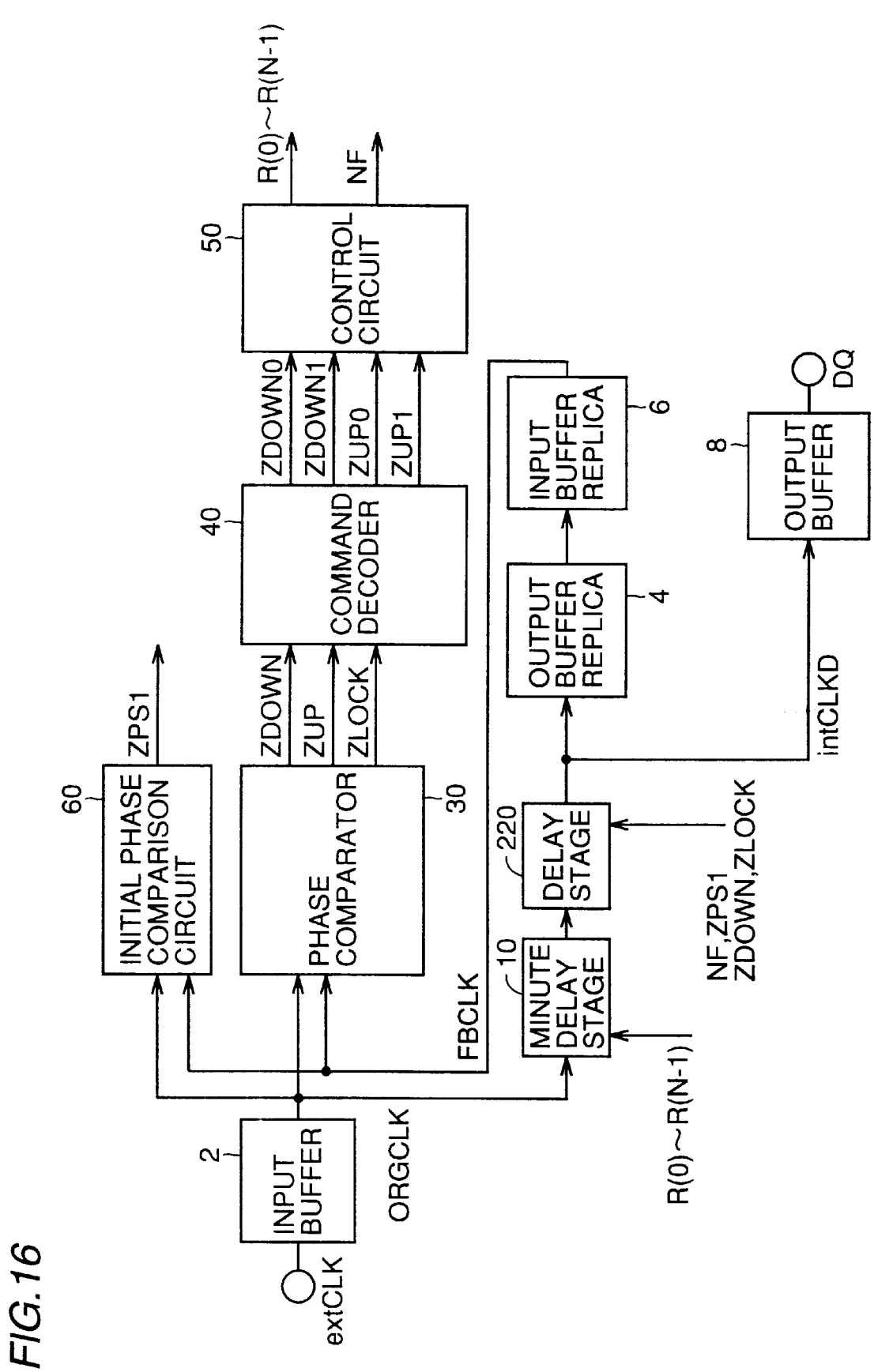
FIG. 16 is a block diagram showing a configuration of the main portion of the semiconductor memory device including the internal clock signal generating circuit according to a third embodiment of the present invention.

The semiconductor memory device shown in FIG. 16 differs from that of FIG. 1 in that it includes an initial phase comparison circuit 60, and a delay stage 220 instead of delay stage 20.

Initial phase comparison circuit 60 is a circuit of which purpose is to shorten an initial lock-in time. The configuration of initial phase comparison circuit 60 shown in FIG. 16 will be described with reference to FIG. 17.

Figure 17:
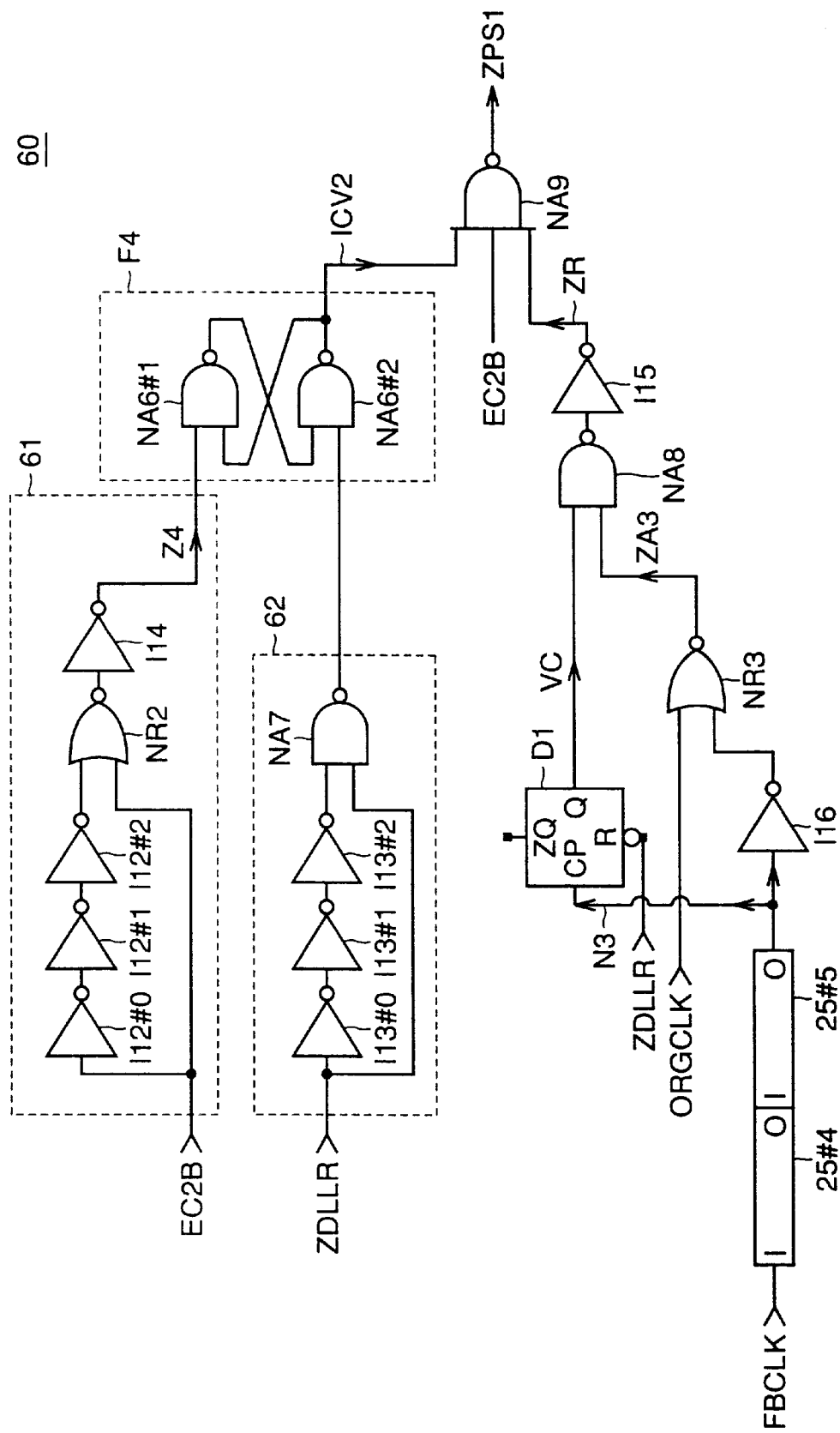
FIG. 17 is a diagram showing an example of a specific configuration of an initial phase comparison circuit 60 shown in FIG. 16.

Referring to FIG. 17, initial phase comparison circuit 60 includes one-shot pulse generating circuits 61 and 62, and a flip flop circuit F4. One-shot pulse generating circuit 61 includes inverters I12#0 to I12#2 and I14, and an NOR circuit NR2. One-shot pulse generating circuit 62 includes inverters I13#0 to I13#2, and an NAND circuit NA7.

One-shot pulse generating circuit 61 will now be described. Inverters I12#0 to I12#2 are serially connected. Inverter I12#0 receives a signal EC2B. NOR circuit NR2 receives an output of inverter I12#2 and signal EC2B. Inverter I14 inverts the signal from NOR circuit NR2, and outputs a signal Z4. Here, signal EC2B is a signal obtained by frequency-dividing clock signal ORGCLK. One-shot pulse generating circuit 61 responds to signal EC2B and generates one-shot pulse signal Z4.

One-shot pulse generating circuit 62 will now be described. Inverters I13#0 to I13#2 are connected in series. Inverter I13#0 receives reset signal ZDLLR. NAND circuit NA7 receives an output of inverter I13#2 and reset signal ZDLLR. One-shot pulse generating circuit 62 responds to reset signal ZDLLR and outputs a one-shot pulse signal.

Flip flop circuit F4 includes cross-coupled NAND circuits NA6#1 and NA6#2. NAND circuit NA6#1 receives at its inputs signal Z4 and an output of NAND circuit NA6#2 (a mask signal ICV2). NAND circuit NA6#2 receives outputs of respective NAND circuits NA6#1 and NA7.

Figure 18:
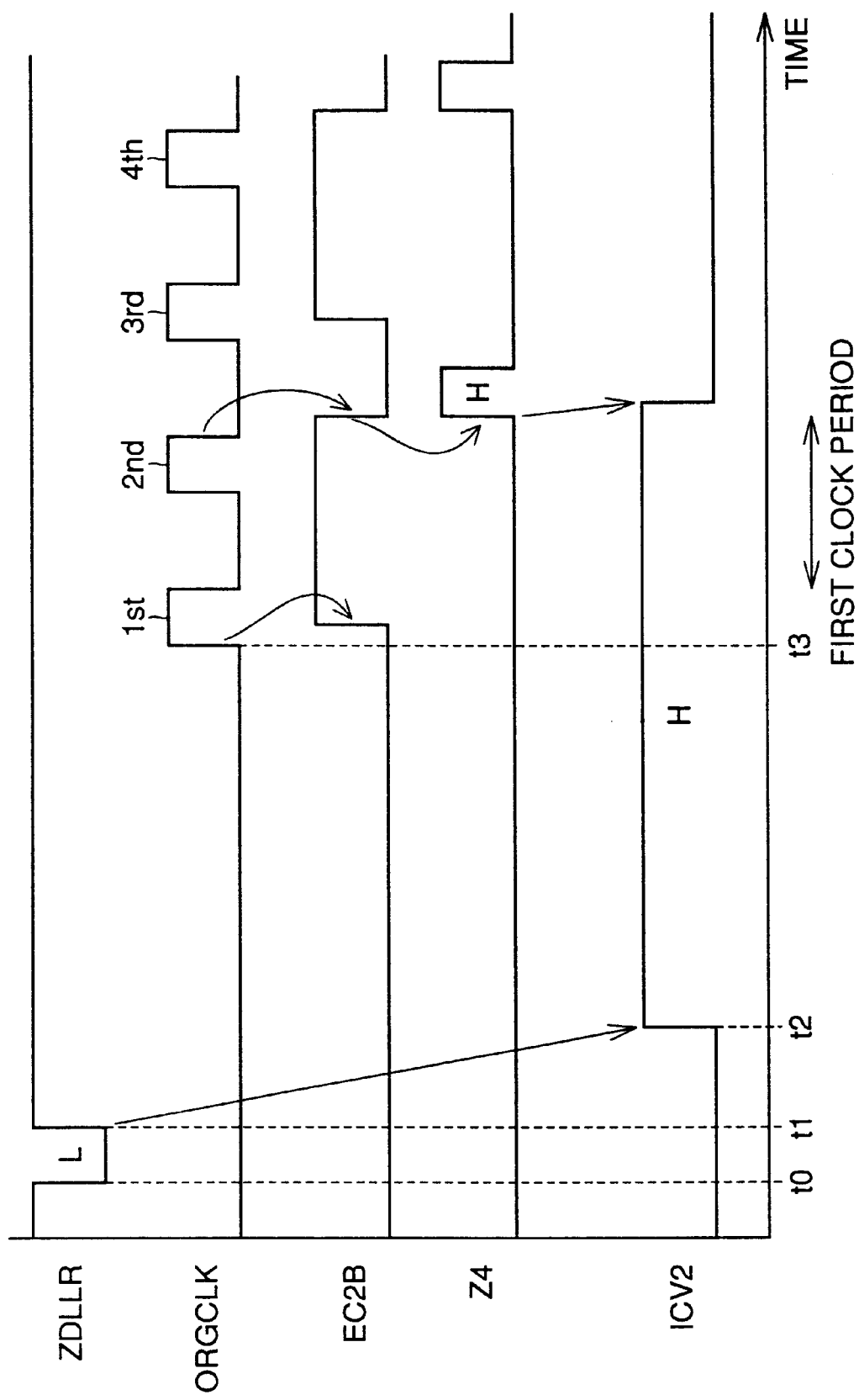
FIG. 18 is a timing chart illustrating a relation between a signal EC2B and a mask signal ICV2 in initial phase comparison circuit 60.

FIG. 18 is a timing chart illustrating a relation between signal EC2B and mask signal ICV2 in initial phase comparison circuit 60. With reference to FIGS. 17 and 18, suppose that reset signal ZDLLR at an L level is input at time t0. When reset signal ZDLLR rises to an H level at time t1, in response, mask signal ICV2 attains an H level at time t2.

At time t3, the first clock signal ORGCLK is input. In response to the rising of the first clock signal ORGCLK, signal EC2B rises to an H level. In response to the falling of the second clock signal ORGCLK, signal EC2B falls to an L level. When signal EC2B attains an L level, one-shot pulse generating circuit 61 outputs pulse signal Z4. Further, when signal Z4 attains an H level, mask signal ICV2 falls to an L level. The time period in which mask signal ICV2 and signal EC2B are both at an H level is referred to as the first clock period.

Referring to FIG. 17, initial phase comparison circuit 60 further includes fixed delay circuits 25#4 and 25#5, inverters I15 and I16, an NOR circuit NR3, NAND circuits NA8 and NA9, and a frequency-dividing circuit D1.

The configurations of fixed delay circuits 25#4 and 25#5 are each identical to that of the above-described fixed delay circuit 25. Fixed delay circuit 25#4 delays feedback signal FBCLK. Fixed delay circuit 25#5 delays an output of fixed delay circuit 25#4 and outputs a signal N3. Inverter I16 inverts signal N3. NOR circuit NR3 receives clock signal ORGCLK and an output of inverter I16.

Frequency-dividing circuit D1 frequency-divides signal N3 received at its CP terminal by 2, and outputs a signal VC from its Q terminal. The R terminal of frequency-dividing circuit D1 receives reset signal ZDLLR. Here, an example of a specific configuration of frequency-dividing circuit D1 shown in FIG. 17 will be described with reference to FIG. 19.

Figure 19:
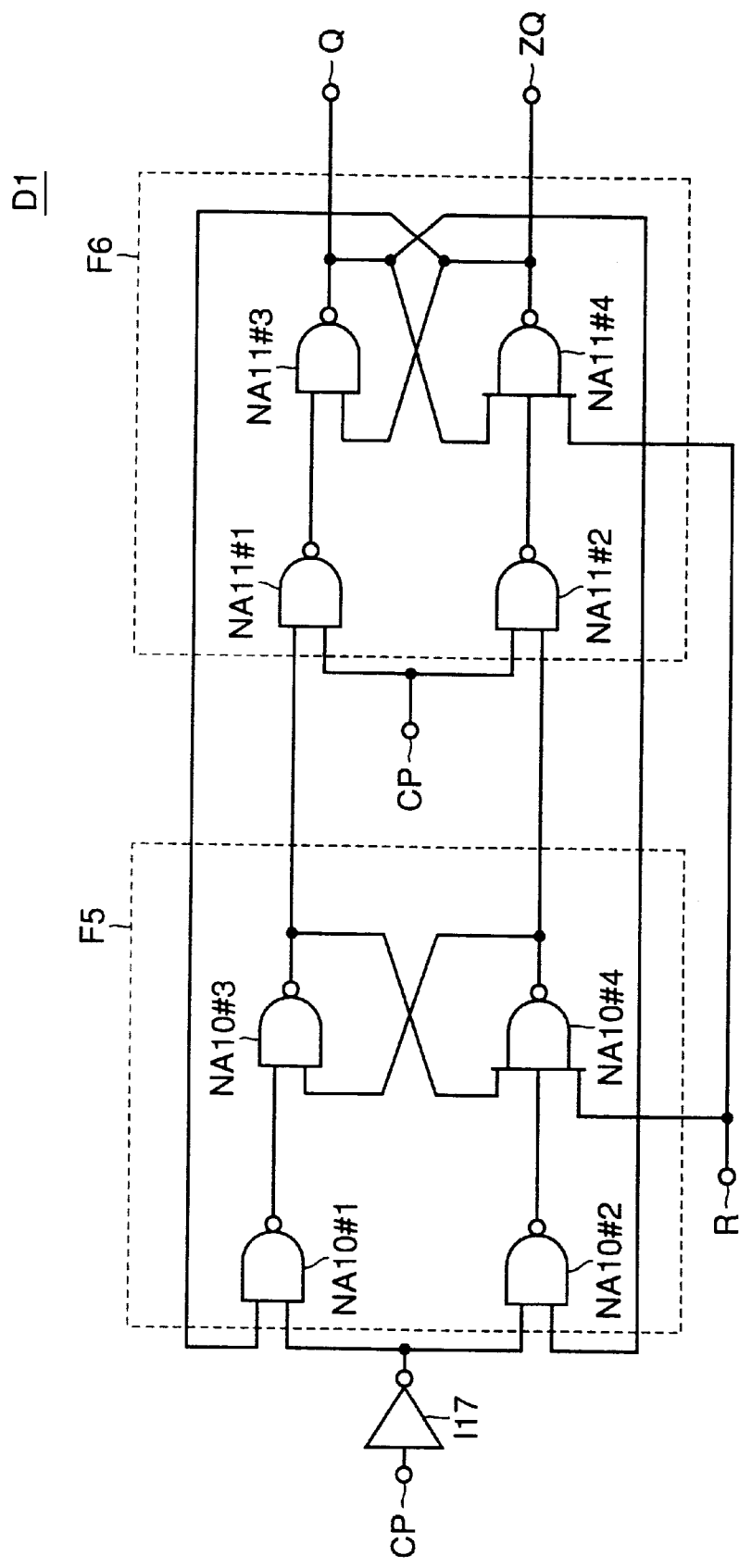
FIG. 19 is a diagram showing an example of a specific configuration of a frequency-dividing circuit D1 shown in FIG. 17.

Referring to FIG. 19, frequency-dividing circuit D1 includes an inverter I17, and flip flop circuits F5 and F6. Inverter I17 inverts a signal received at CP terminal.

Flip flop circuit F5 includes NAND circuits N10#1 and N10#2, and cross-coupled NAND circuits N10#3 and N10#4. NAND circuit N10#1 receives the signal at ZQ terminal and an output of inverter I17. NAND circuit N10#2 receives the signal at Q terminal and the output of inverter I17.

Flip flop circuit F6 includes NAND circuits N11#1 and N11#2, and cross-coupled NAND circuits N11#3 and N11#4. NAND circuit N11#1 receives an output of NAND circuit N10#3 and the signal at CP terminal. NAND circuit N11#2 receives an output of NAND circuit N10#4 and the signal at CP terminal. The output node of NAND circuit N11#3 is connected with Q terminal, and the output node of NAND circuit N11#4 is connected with ZQ terminal. NAND circuits N10#4 and N11#4 further receive the signal at R terminal, respectively.

Referring to FIG. 17, NAND circuit NA8 receives signal VC output from frequency-dividing circuit D1 and a signal ZA3 output from NOR circuit NR3. Inverter I15 inverts the signal from NAND circuit NA8 and outputs a signal ZR.

Signal ZR makes transitions according to the phase relation between clock signal ORGCLK and signal N3 that is feedback signal FBCLK delayed by a prescribed period of time. NAND circuit NA9 outputs a signal ZPS1 based on mask signal ICV2, signal EC2B and signal ZR.

Figure 20:
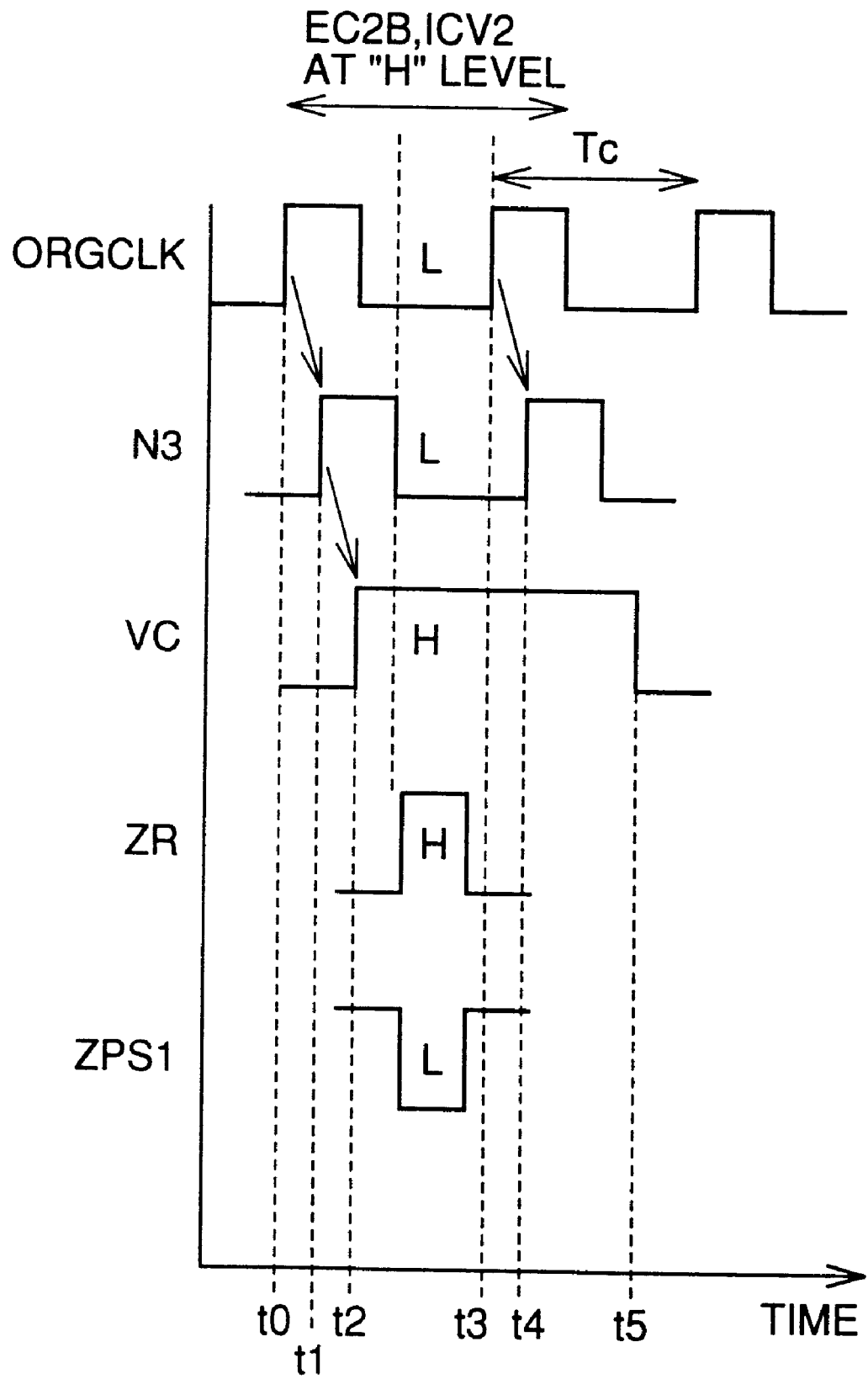
FIGS. 20 and 21 are timing charts illustrating operations of initial phase comparison circuit 60 according to the third embodiment of the present invention.
Figure 21:
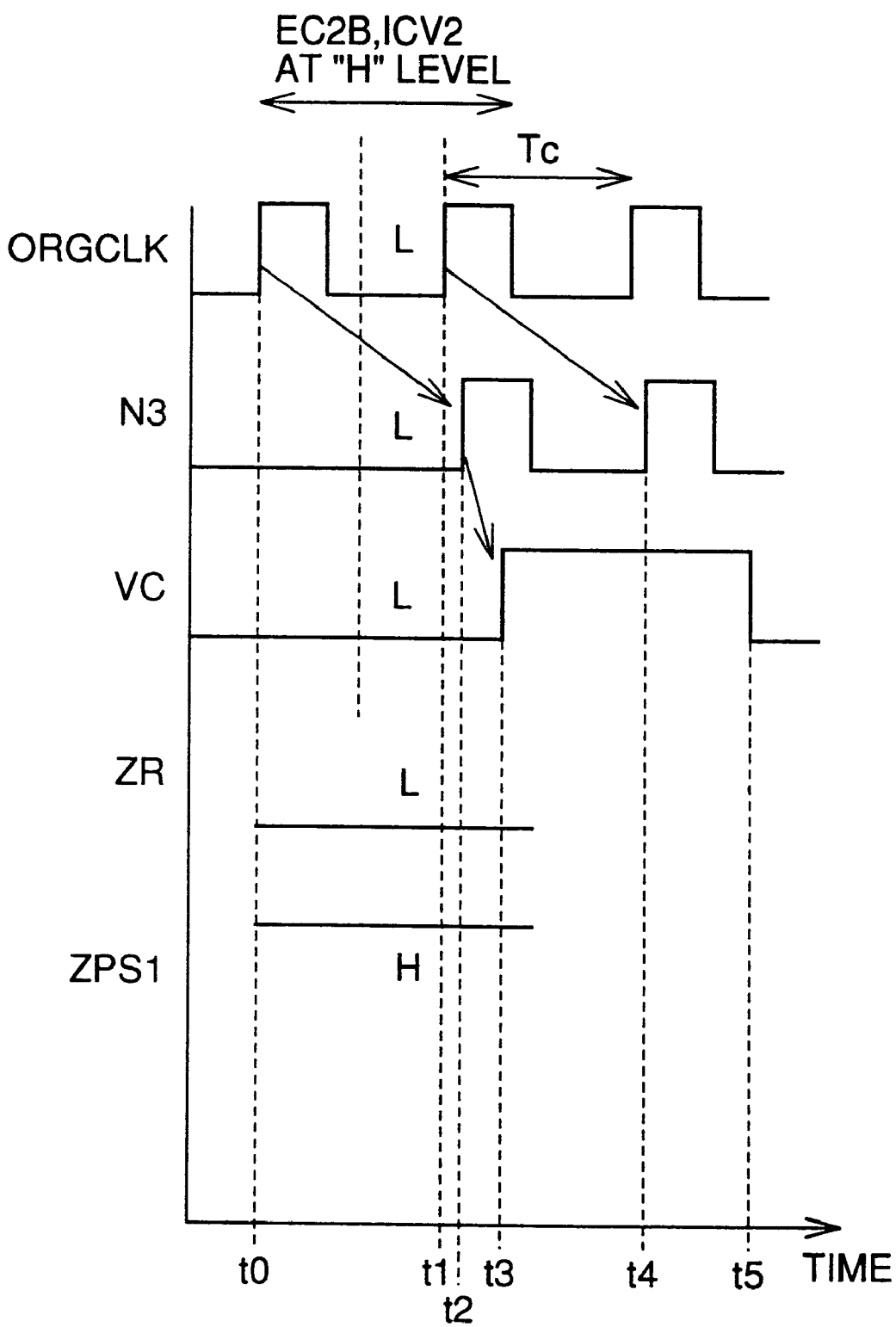

FIGS. 20 and 21 are timing charts illustrating the operation of initial phase comparison circuit 60 according to the third embodiment of the present invention. The operation of initial phase comparison circuit 60 will now be described with reference to FIGS. 17 to 21.

Initial phase comparison circuit 60 determines whether cycle length Tc to achieve phase lock is long or not, based on the phase relation of clock signal ORGCLK and signal N3, during the first clock period. As described above, the first clock period is determined based on mask signal ICV2 and signal EC2B.

Here, suppose that the delay amount in fixed delay circuit 25 is 3 ns. Signal N3 is thus considered to be feedback signal FBCLK delayed by 6 ns.

With reference to FIG. 20, the first clock signal ORGCLK is input at time t0, and the second clock signal ORGCLK at time t3. Feedback signal FBCLK for the first clock signal ORGCLK is generated, and the first signal N3 for this feedback signal FBCLK is generated at time t1. If the minimum delay time required for the feedback is 5 ns, t1 is nearly equal to t0+5 ns+6 ns. In response to the rising of the first signal N3, signal VC attains an H level at time t2.

At time t3, the second clock signal ORGCLK is input. Corresponding to the second clock signal ORGCLK, the second signal N3 is generated at time t4. In response to the falling of the second signal N3, signal VC attains an L level at time t5.

In this case, cycle length Tc of clock signal ORGCLK is determined to be long. Signal ZR attains an H level. Signal ZPS1 at an L level is generated within the first clock period.

With reference to FIG. 21, the first clock signal ORGCLK is input at time t0 and the second first clock signal ORGCLK at time t1. In response to the first clock signal ORGCLK, the first signal N3 is generated at time t2 (>t1). When the first signal N3 rises to an H level, signal VC attains an H level at time t3. In response to the second clock signal ORGCLK, the second signal N3 is generated at time t4. When the second signal N3 falls to an L level, signal VC attains an L level at time t5.

In this case, cycle length Tc of clock signal ORGCLK is determined to be short. Signal ZR remains at an L level, and signal ZPS1 remains at an H level.

With reference to FIG. 16, the delay amount in delay stage 220 is controlled based on signal ZPS1, signal NF, down signal ZDOWN, and lock signal ZLOCK.

Figure 22:
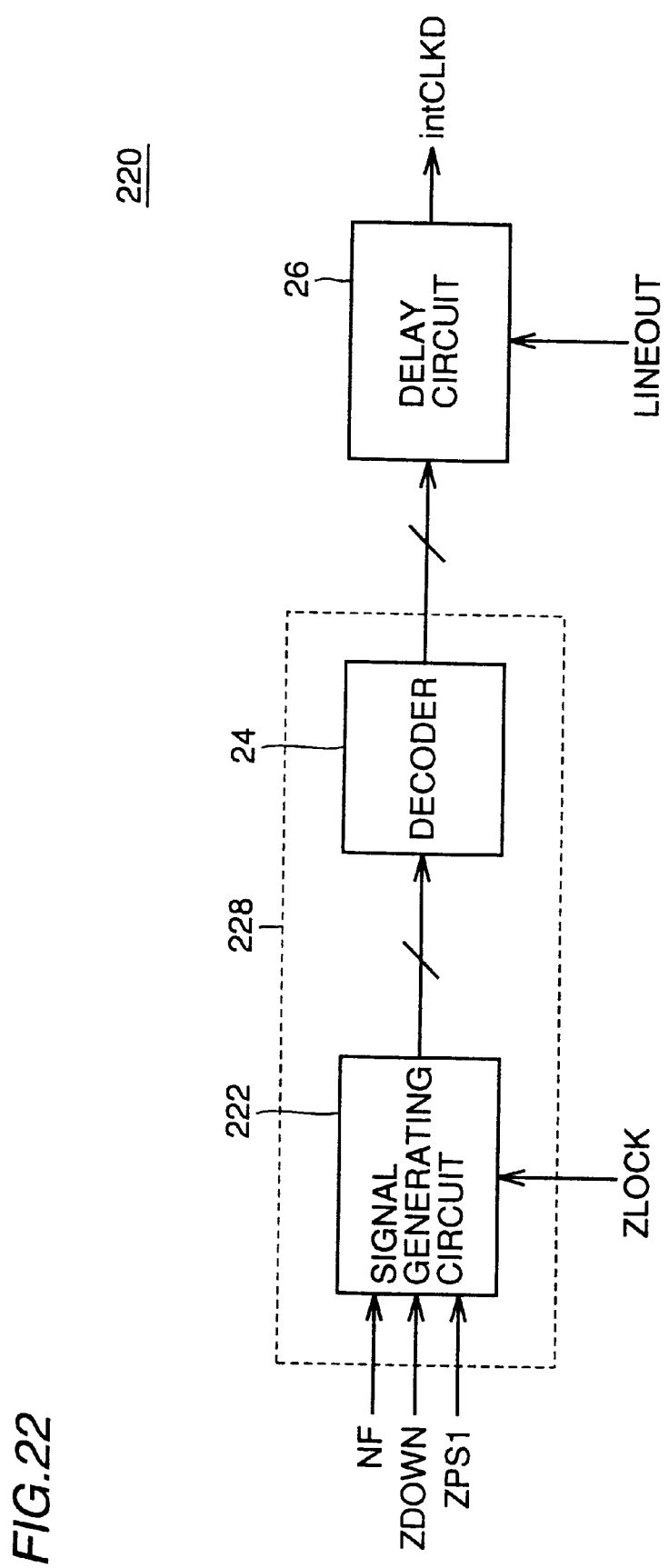
FIG. 22 is a block diagram showing a configuration of a delay stage 220 shown in FIG. 16.

The configuration of delay stage 220 shown in FIG. 16 will be described with reference to FIG. 22. Referring to FIG. 22, delay stage 220 includes a delay circuit 26 having a plurality of fixed delay circuits therein, and a select signal generating circuit 228. Select signal generating circuit 228 includes a signal generating circuit 222 and a decoder 24.

Decoder 24 decodes an output of signal generating circuit 222 and outputs a select signal. In response to the select signal, delay circuit 26 delays signal LINEOUT output from minute delay stage 10 and outputs internal clock signal intCLKD.

Figure 23:
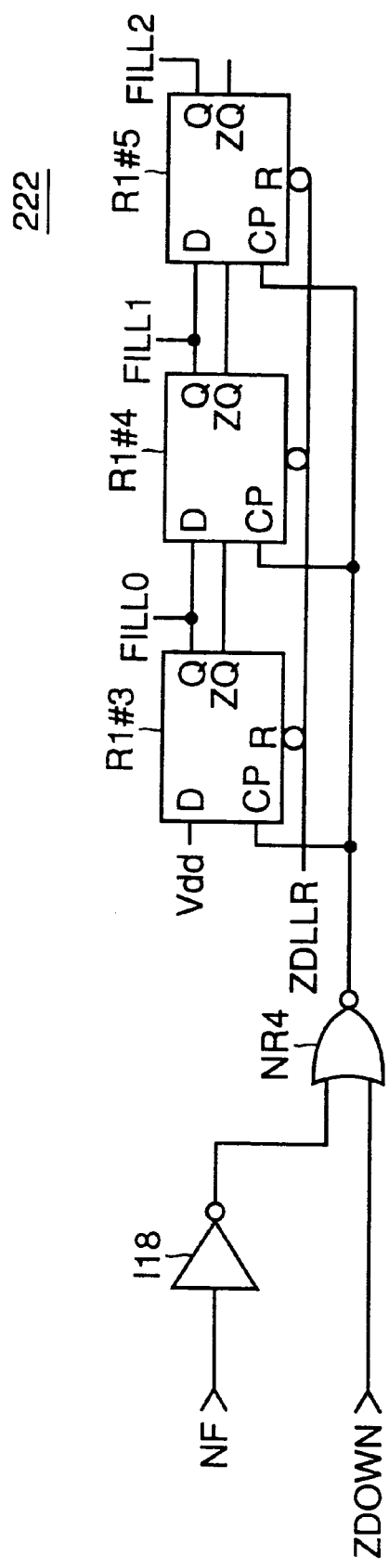
FIGS. 23 and 24 are diagrams showing a circuit configuration of a signal generating circuit 222 shown in FIG. 22.
Figure 24:
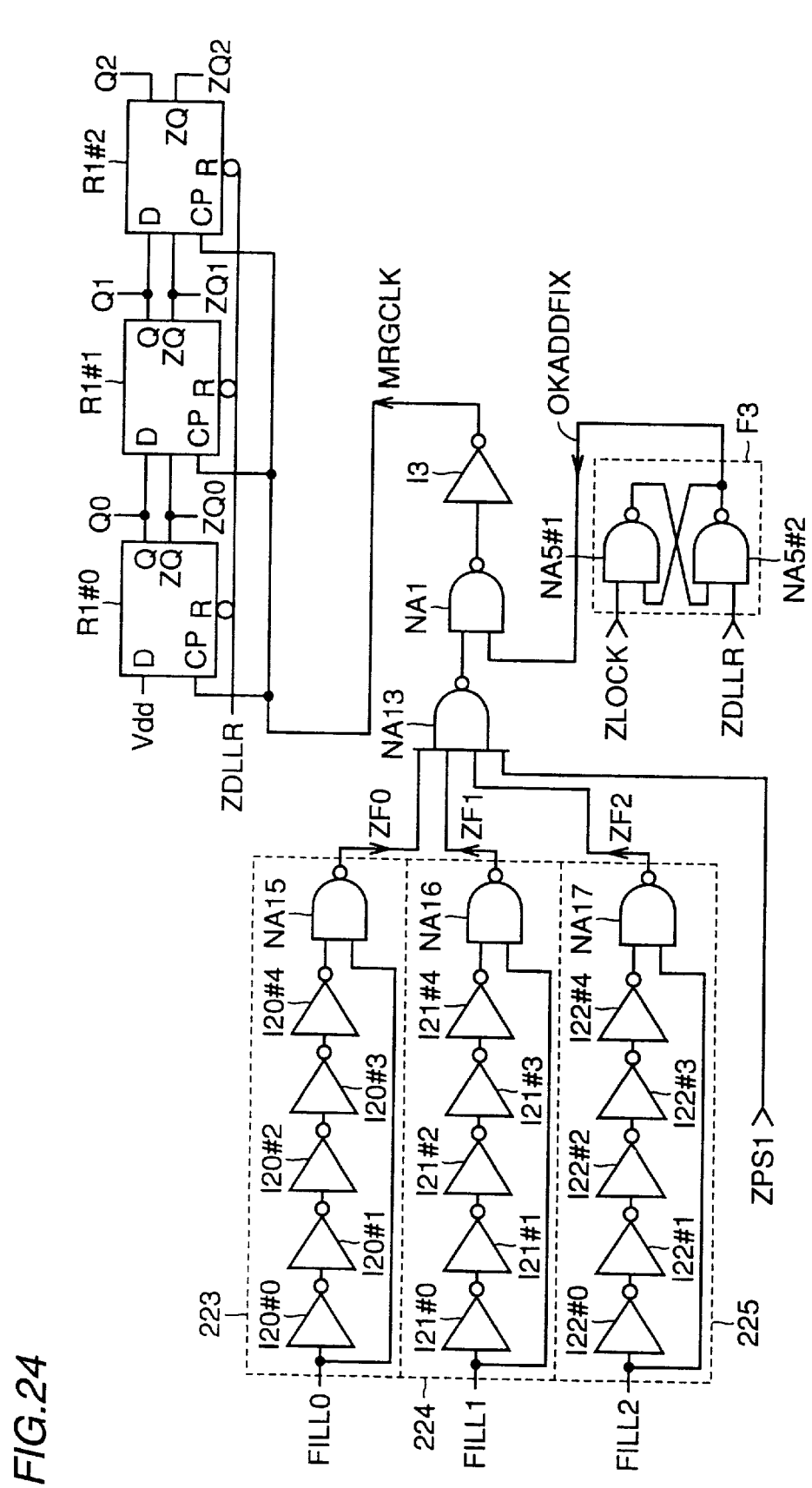

Signal generating circuit 222 shown in FIG. 22 will now be described with reference to FIGS. 23 and 24. FIGS. 23 and 24 show circuit configuration of signal generating circuit 222 shown in FIG. 22.

The circuit shown in FIG. 23 includes an inverter I18, an NOR circuit NR4 and shift registers R1#3 to R1#5. Inverter I18 inverts signal NF. NOR circuit NR4 receives an output of inverter I2 and down signal ZDOWN.

Shift registers R1#3 to R1#5 are serially connected. The configuration of each of shift registers R1#3 to R1#5 is identical to that of shift register R1 described above. R terminals of respective shift registers R1#3 to R1#5 each receive reset signal ZDLLR. CP terminals of respective shift registers R1#3 to R1#5 each receive an output of NOR circuit NR4.

D terminal of shift register R1#3 receives power supply potential Vdd. Q terminal of shift register R1#3 outputs a signal FILL0. D terminal of shift register R1#4 receives signal FILL0. Q terminal of shift register R1#4 outputs a signal FILL1. D terminal of shift register R1#5 receives signal FILL1. Q terminal of shift register R1#5 outputs a signal FILL2. Values of shift registers R1#3, . . . are shifted bit by bit in response to signal NF and down signal ZDOWN.

The circuit shown in FIG. 24 includes one-shot pulse generating circuits 223 to 225, NAND circuits NA13 and NA1, a flip flop circuit F3, an inverter I3, and shift registers R1#0 to R1#2.

One-shot pulse generating circuit 223 includes inverters I20#0 to I20#4 and an NAND circuit NA15. Inverters I20#0 to I20#4 are serially connected. NAND circuit NA15 receives an output of inverter I20#4 and signal FILL0.

One-shot pulse generating circuit 224 includes inverters I21#0 to I21#4 and an NAND circuit NA16. Inverters I21#0 to I21#4 are serially connected. NAND circuit NA16 receives an output of inverter I21#4 and signal FILL1.

One-shot pulse generating circuit 225 includes inverters I22#0 to I22#4 and an NAND circuit NA17. Inverters I22#0 to I22#4 are serially connected. NAND circuit NA17 receives an output of inverter I22#4 and signal FILL2.

One-shot pulse generating circuits 223, 224 and 225 output signals ZF0, ZF1 and ZF2, respectively.

NAND circuit NA13 receives signals ZF0, ZF1 and ZF2, and signal ZPS1. NAND circuit NA1 receives at its inputs an output of NAND circuit NA13 and a signal OKADDFIX output from flip flop circuit F3.

Inverter I3 inverts an output of NAND circuit NA1 and outputs clock signal MRGCLK. Shift registers R1#0 to R1#2 operate in response to clock signal MRGCLK, as described above, and output signals Q0 and ZQ0, Q2 and ZQ2, respectively.

With reference to FIGS. 22 to 24, signals FILL0, FILL1 and FILL2 each make a transition to an H level one at a time in this order in response to down signal ZDOWN at an L level and signal NF at an H level.

When one or more signals FILL0 to FILL2 attain an H level, corresponding one or more one-shot pulse generating circuits 223 to 225 output respective one or more signals (ZF0 to ZF2) at an L level. The output of NAND circuit NA13 thus attains an H level.

When signal ZPS1 at an L level is input, the output of NAND circuit NA13 also attains an H level, regardless of signals FILL0 to FILL2.

The output of NAND circuit NA13 at an H level causes shift registers R1#0 to R1#2 to operate. Decoder 24 decodes signals Q0 to Q2 and ZQ0 to ZQ2, and outputs a select signal.

As described above, signal ZPS1 is activated within the first clock period dependent on cycle length Tc, and thus, a certain fixed delay circuit included in delay stage 20 is selected. As a result, the output of minute delay stage 10 shown in FIG. 16 is delayed by 3 ns. That is, it becomes possible to shorten the time required for phase lock.

For example, in the case of DDR-SDRAM, it is required that the phase lock be established within 200 clocks. To achieve this, conventionally more than 110 delay elements have been necessary. If the frequency to achieve phase lock is low, 110×2 clocks=220 clocks will be necessary for the phase lock. Therefore, such conventional configuration cannot be applied to the DDR-SDRAM.

As described above, however, if the internal clock signal generating circuit according to the third embodiment of the present invention is employed, a certain amount of delay can be added in the initial clock period, and thus a rapid phase lock can be realized. Accordingly, the configuration of the third embodiment is applicable to DDR-SD RAM.

Fourth Embodiment

The semiconductor memory device including an internal clock signal generating circuit according to the fourth embodiment of the present invention will be described with reference to FIGS. 25 and 26.

Figure 25:
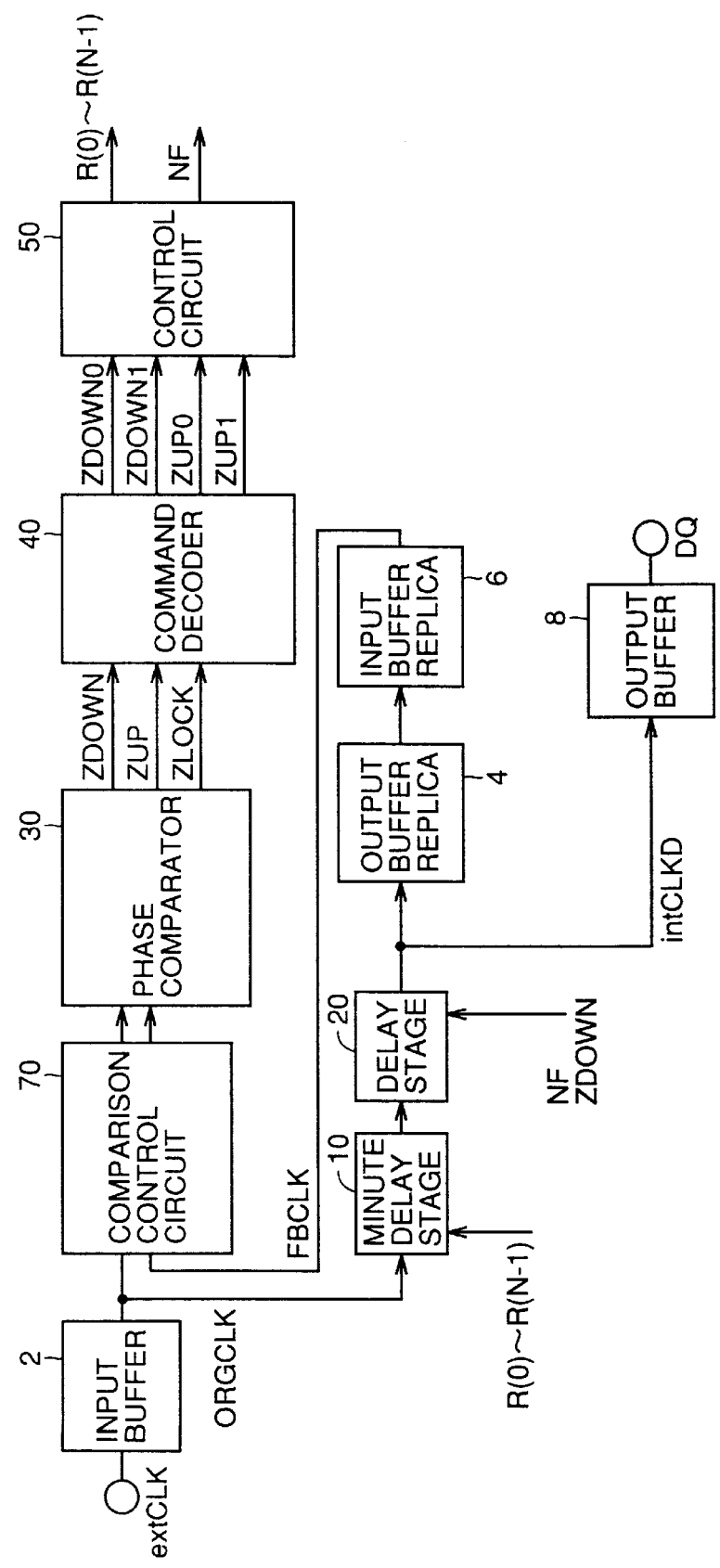
FIGS. 25 and 26 are diagrams showing a configuration of the main portion of the semiconductor memory device including the internal clock signal generating circuit according to a fourth embodiment of the present invention.

The semiconductor memory device shown in FIG. 25 is provided with a minute delay stage 10 and a delay stage 20 as delay stages. The semiconductor memory device shown in FIG. 25 differs from a conventional semiconductor memory device in that it includes a comparison control circuit 70.

Figure 26:
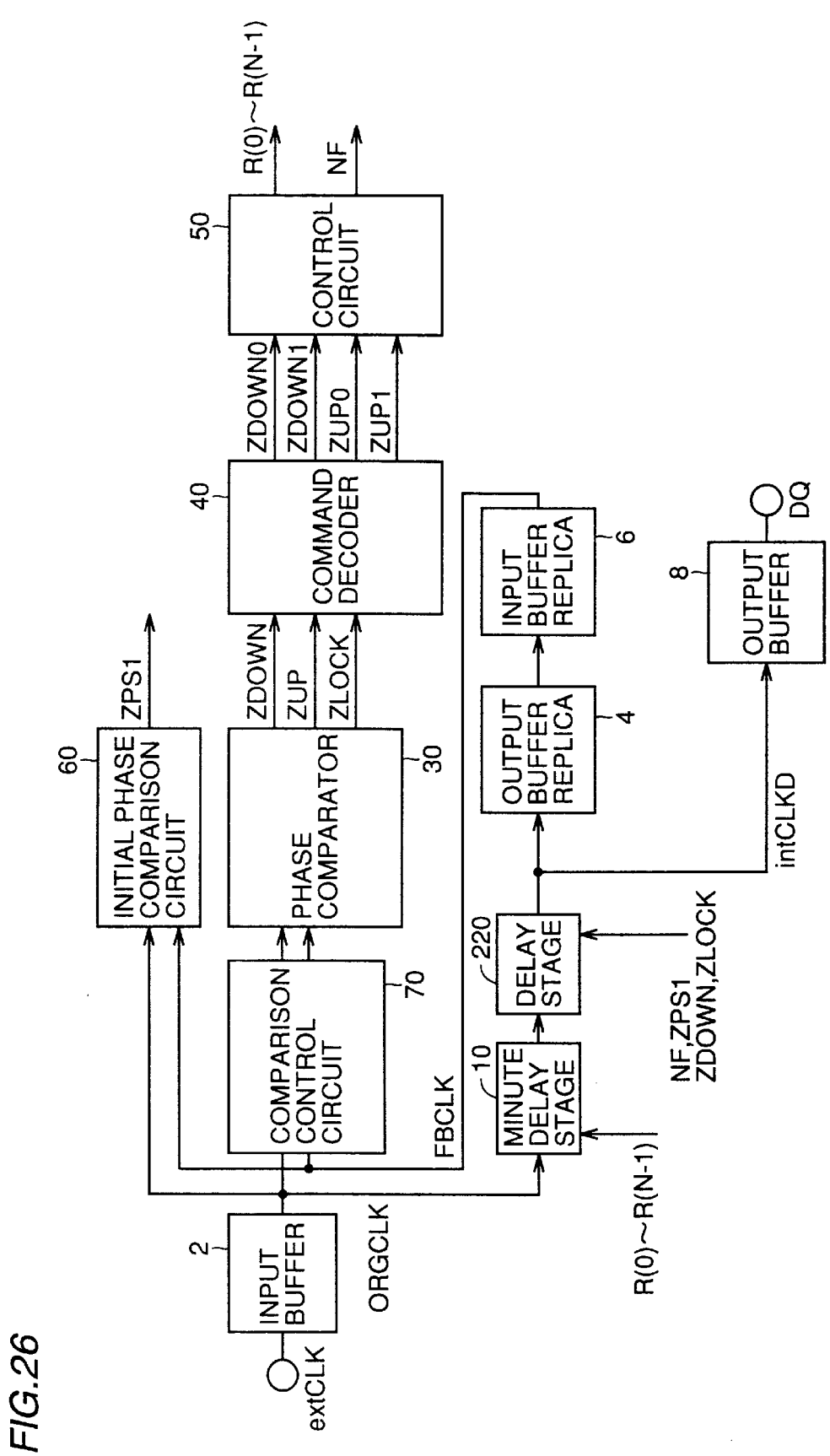

The semiconductor memory device shown in FIG. 26 includes minute delay stage 10 and delay stage 220 as delay stages. The semiconductor memory device shown in FIG. 26 is different from the semiconductor memory device shown in FIG. 16 in that it includes comparison control circuit 70. Comparison control circuit 70 shifts (selects) feedback signal FBCLK to be transmitted to phase comparator 30 dependent on the cycle length to achieve phase lock.

Figure 27:
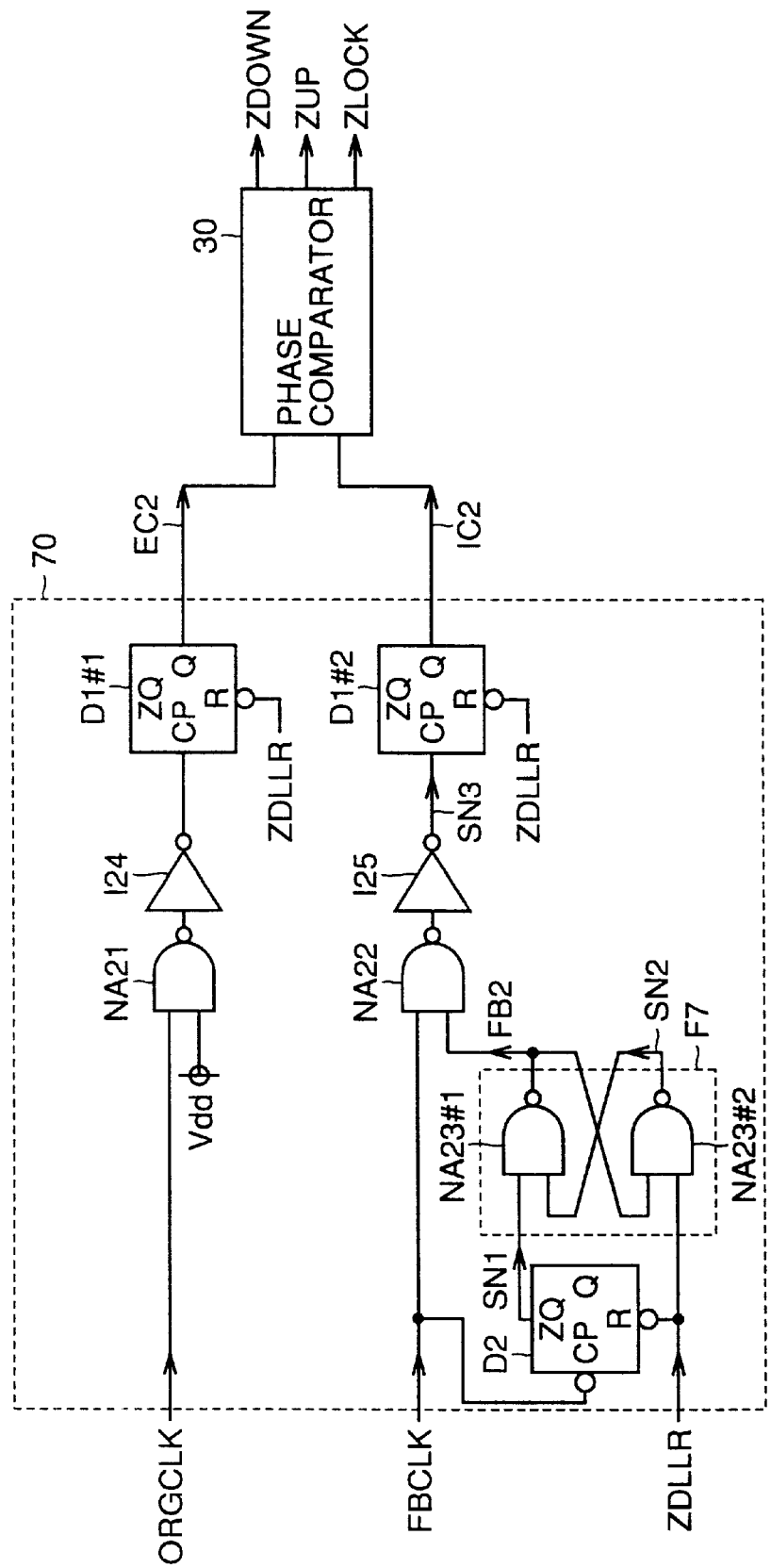
FIG. 27 is a circuit diagram showing a configuration of a comparison control circuit 70 shown in FIGS. 25 and 26.

Comparison control circuit 70 shown in FIGS. 25 and 26 will now be described with reference to FIG. 27. FIG. 27 shows the relation with phase comparator 30 for reference.

Referring to FIG. 27, comparison control circuit 70 includes an inverter 124, an NAND circuit NA21, and a frequency-dividing circuit D1#1

NAND circuit NA21 receives clock signal ORGCLK and power supply potential Vdd. Inverter I24 inverts an output of NAND circuit NA21. Frequency-dividing circuit D1#1 has a configuration identical to that of the above-described frequency-dividing circuit D1. CP terminal of frequency-dividing circuit D1#1 is connected with an output of inverter I24. Frequency-dividing circuit D1#1 outputs a signal EC2 from its Q terminal Comparison control circuit 70 further includes an inverter I25, an NAND circuit NA22, frequency-dividing circuits D1#2 and D2, and a flip flop circuit F7. Frequency-dividing circuit D2 receives feedback signal FBCLK at its CP terminal, and outputs a signal SN1 from its ZQ terminal. Frequency-dividing circuit D2 receives reset signal ZDLLR at R terminal.

Here, an example of a specific configuration of frequency-dividing circuit D2 shown in FIG. 27 will be described with reference to FIG. 28.

Figure 28:
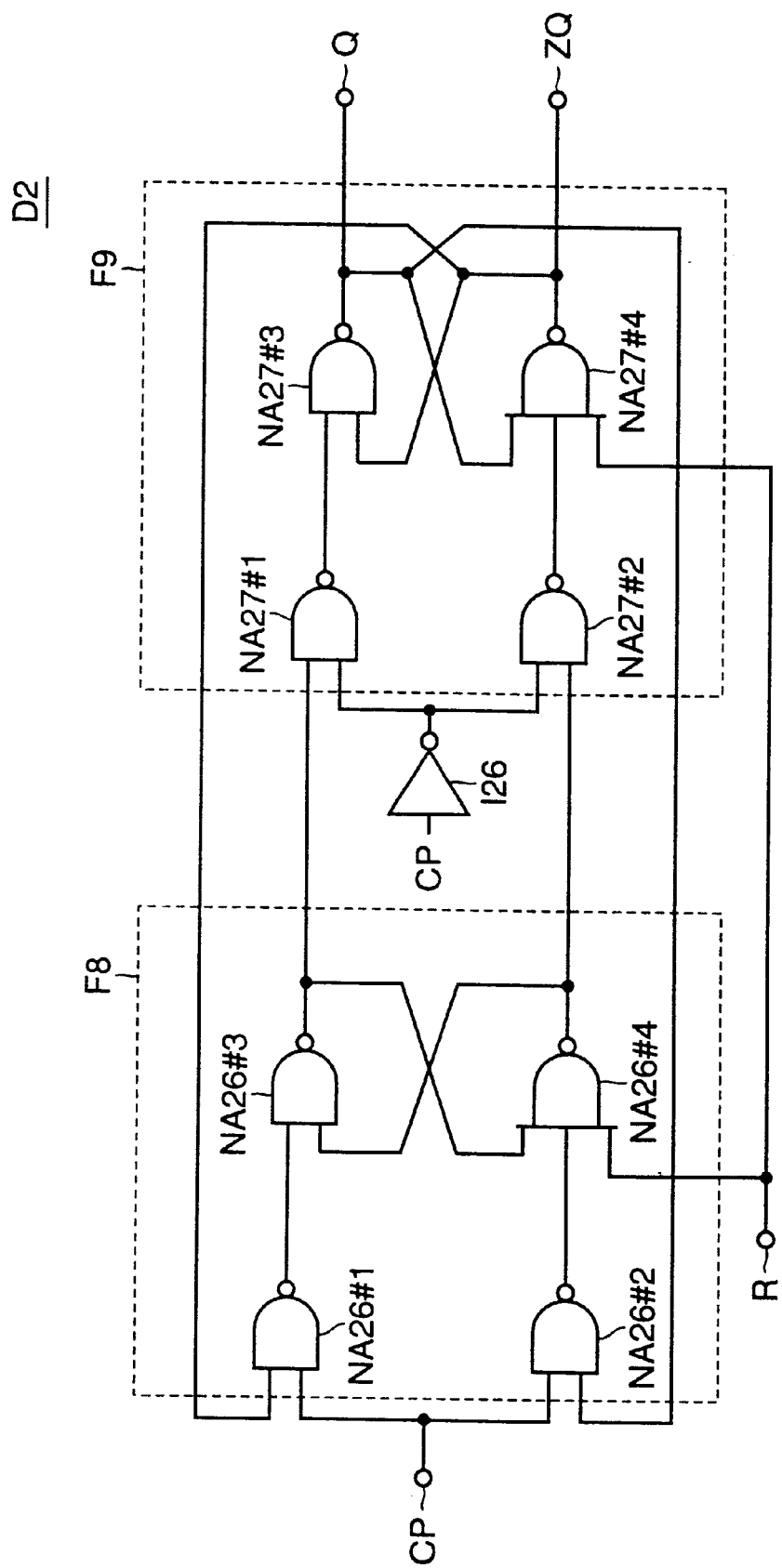
FIG. 28 is a diagram showing an example of a specific configuration of a frequency-dividing circuit D2 shown in FIG. 27.

With reference to FIG. 28, frequency-dividing circuit D2 includes an inverter I26, and flip flop circuits F8 and F9. Inverter I26 inverts the signal received at CP terminal.

Flip flop circuit F8 includes NAND circuits N26#1 and N26#2, and cross-coupled NAND circuits N26#3 AND N26#4. NAND circuit N26#1 receives the signals at ZQ and CP terminals. NAND circuit N26#2 receives the signals at Q and CP terminals.

Flip flop circuit F9 includes NAND circuits N27#1 and N27#2, and cross-coupled NAND circuits N27#3 and N27#4. NAND circuit N27#1 receives an output of NAND circuit N26#3 and an output of inverter I26. NAND circuit N27#2 receives outputs of NAND circuit N26#4 and of inverter I26. The output node of NAND circuit N27#3 is connected with Q terminal, and the output node of NAND circuit N27#4 is connected with ZQ terminal. NAND circuits N26#4 and N27#4 further receive the signal at R terminal, respectively.

With reference to FIG. 27, flip flop circuit F7 includes cross-coupled NAND circuits NA23#1 and NA23#2. NAND circuit NA23#1 receives signal SN1 and an output signal SN2 of NAND circuit NA23#2. NAND circuit NA23#2 receives an output signal FB2 of NAND circuit NA23#1 and reset signal ZDLLR.

NAND circuit NA22 receives feedback signal FBCLK and signal FB2. Inverter I25 inverts the output of NAND circuit NA22. Frequency-dividing circuit D1#2 has a configuration identical to that of frequency-dividing circuit D1. Frequency-dividing circuit D1#2 receives an output signal SN3 of inverter I25 at its CP terminal, and outputs a signal IC2 from Q terminal.

Figure 29:
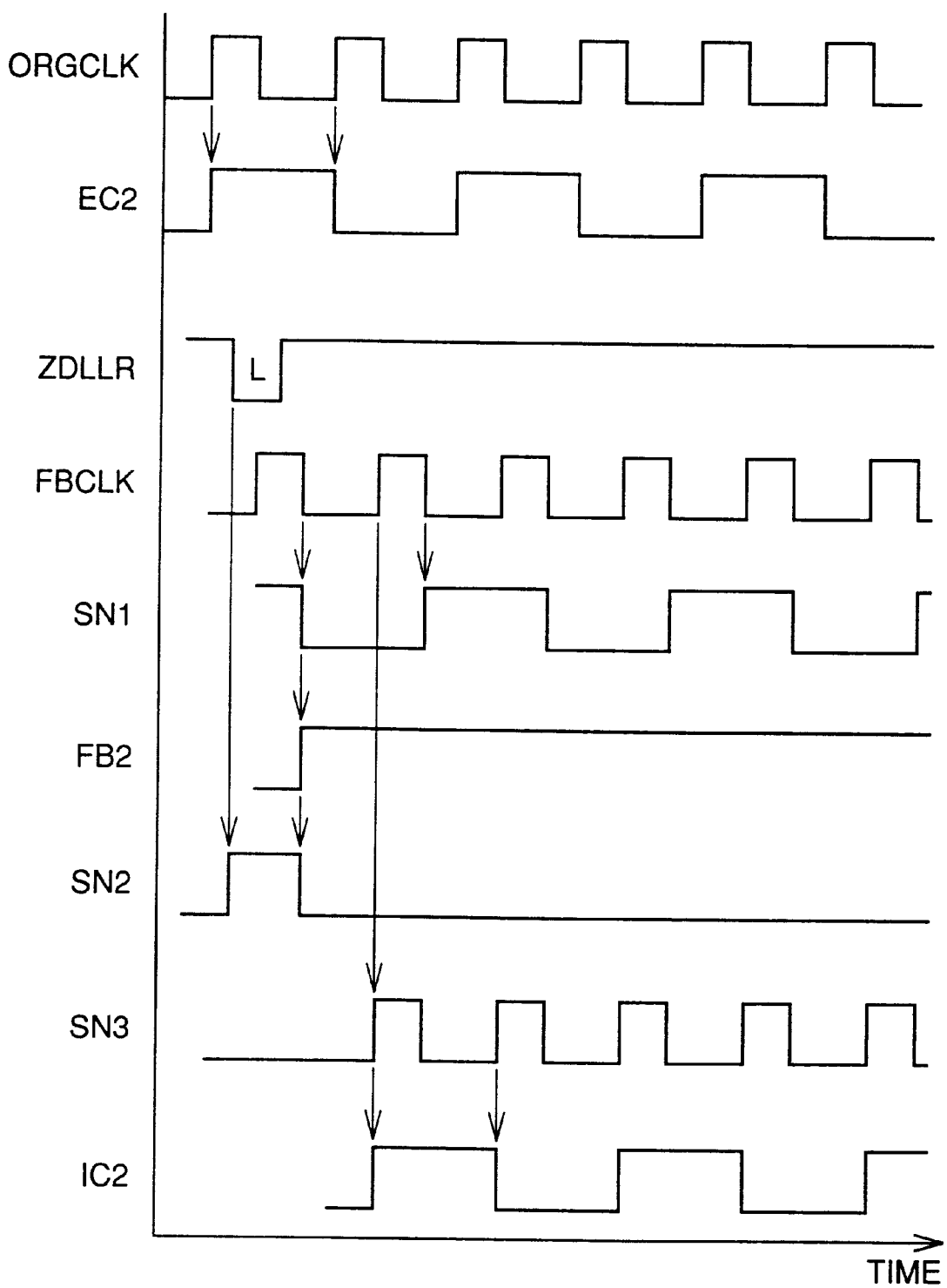
FIG. 29 is a timing chart illustrating the operation of a comparison control circuit 70 shown in FIG. 27.

The operation of comparison control circuit 70 shown in FIG. 27 will be described with reference to a time chart in FIG. 29.

When clock signal ORGCLK attains an H level, signal EC2 switches its voltage level. When reset signal ZDLLR is input, signal SN2 attains an H level. When the first feedback signal FBCLK falls to an L level, signal SN1 makes a transition from an H level to an L level hereinafter, signal SN1 switches its voltage level in response to each falling of feedback signal FBCLK.)

In response to the first falling of signal SN1, signal FB2 attains an H level, and signal SN2 falls to an L level. During this time period, signal SN3 remains at an L level.

When signal FB2 attains an H level, signal SN3 switches its voltage level in response to feedback signal FBCLK. Signal IC2 switches its voltage level every time when signal SN3 attains an H level.

Phase comparator 30 located in the succeeding stage detects a phase difference between signals EC2 and IC2. In this case, the phase difference is detected every two cycles. Comparison control circuit 70 thus masks feedback signal FBCLK having arrived first. Accordingly, phase comparator 30 in the succeeding stage detects the phase difference between the signal obtained by frequency-dividing clock signal ORGCLK and the signal obtained by frequency-dividing feedback signal FBCLK that is shifted by one clock.

Figure 30:
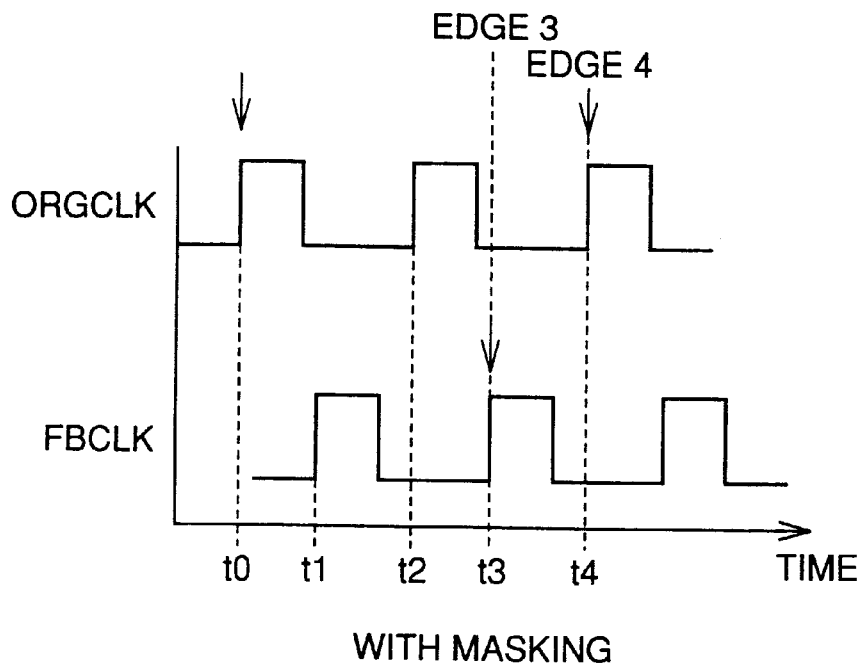
FIG. 30 is a timing chart illustrating the effect of phase comparison according to the fourth embodiment of the present invention.

The effects of phase comparison according to the fourth embodiment of the present invention will now be described with reference to FIGS. 30 and 31. FIG. 30 is a timing chart illustrating the effects of phase comparison in the fourth embodiment, and FIG. 31 is a timing chart illustrating the phase comparison in the absence of comparison control circuit 70.

Suppose that the phase difference is detected every second cycle, for example. In this case, in response to clock signal ORGCLK at times t0, t2. t4 . . . , feedback signal FBCLK is obtained at times t1, t3, t5 . . . , as shown in FIGS. 30 and 31.

Figure 31:
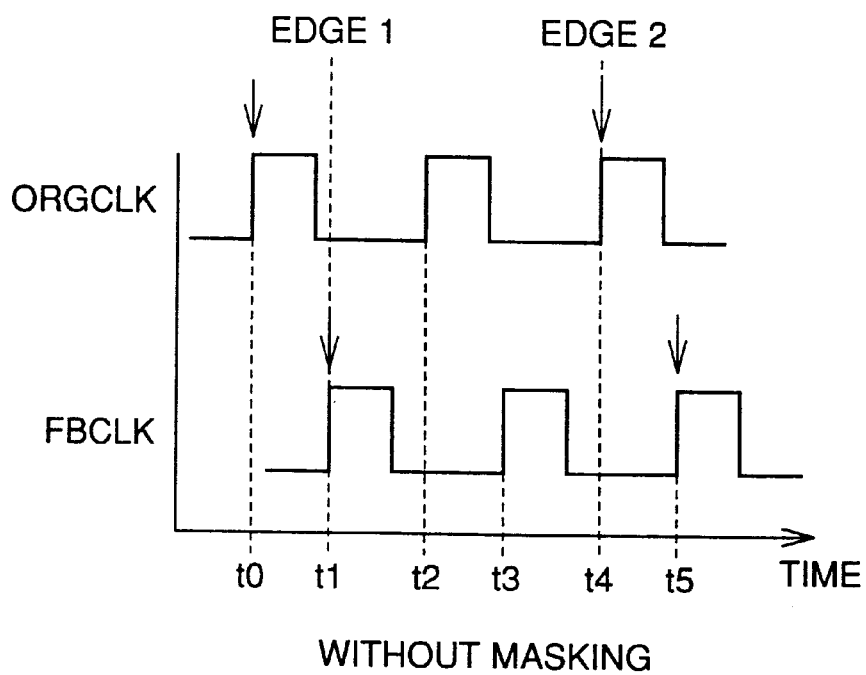
FIG. 31 is a timing chart illustrating the state of phase comparison in the absence of comparison control circuit 70.

With reference to FIG. 31, if comparison control circuit 70 is not provided, there is a need to increase the delay amount so as to compensate for the difference between an edge (edge 1) of feedback signal FBCLK at time t1 and an edge (edge 2) of clock signal ORGCLK at time t4.

In contrast, as shown in FIG. 30, with the configuration of the fourth embodiment of the present invention, feedback signal FBCLK at time t1 is asked, and thus it is only necessary to compensate for the difference between an edge (edge 3) of feedback signal FBCLK at time t3 and an edge (edge 4) of clock signal ORGCLK at time t4. Accordingly, the initial lock-in time can be shortened.

Fifth Embodiment

A phase comparator according to the fifth embodiment of the present invention will be described. The phase comparator of the fifth embodiment is capable of detecting minute timing differences between input signals and holding the detected states.

Figure 32:
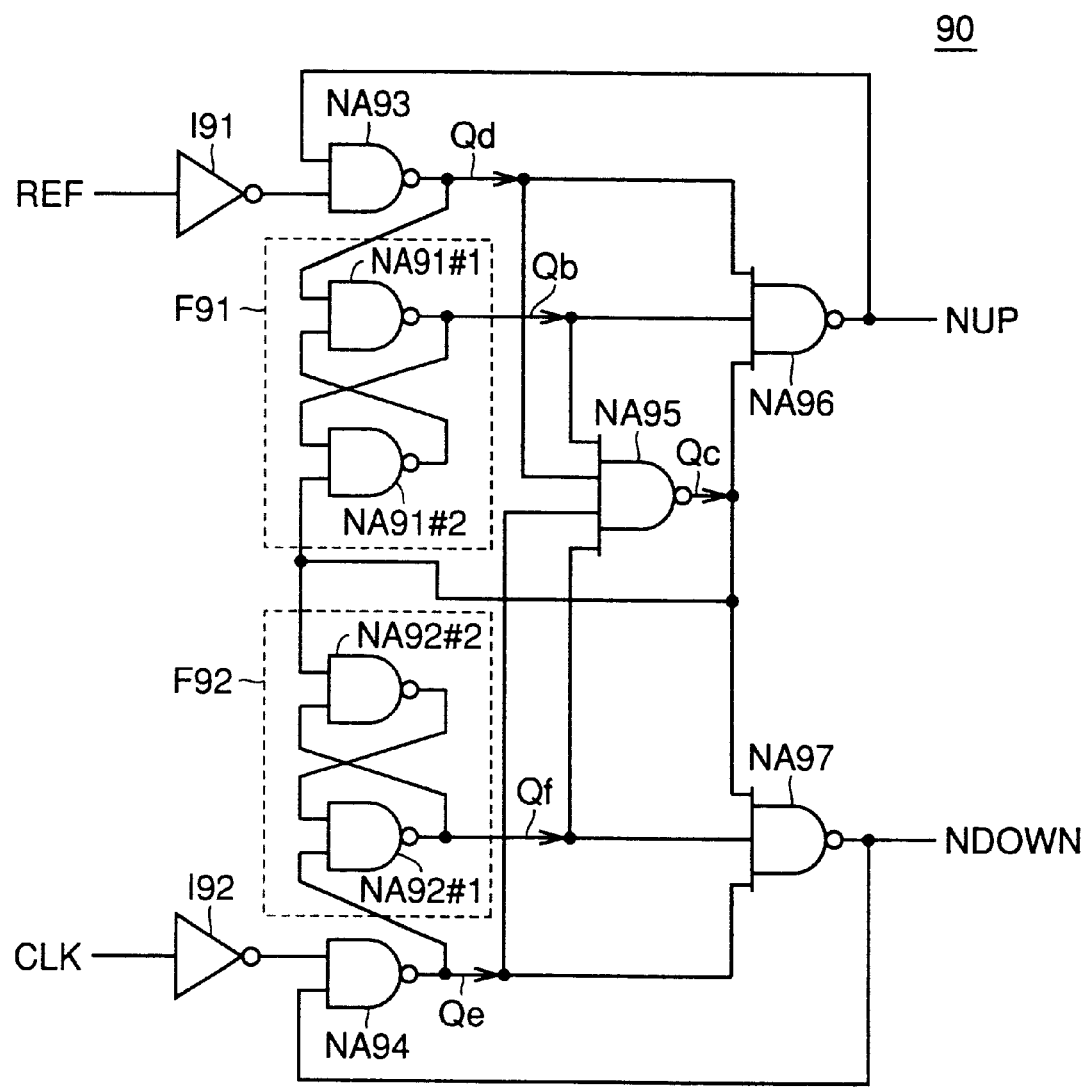
FIG. 32 is a circuit diagram showing a configuration of a phase comparator 90.

Here, an example of phase comparator will be described in brief for contrast. FIG. 32 is a circuit diagram showing a configuration of a phase comparator 90. With reference to FIG. 32, phase comparator 90 includes inverters I91 and I92, flip flop circuits F91 and F92, and NAND circuits NA93, NA94, NA95, NA96 and NA97.

Inverter I91 inverts a reference signal REF input therein. Inverter I92 inverts a clock signal CLK input therein. NAND circuit NA93 receives an output of inverter I91 and an up signal NUP output from NAND circuit NA96. NAND circuit NA94 receives an output of inverter I92 and a down signal NDOWN output from NAND circuit NA97.

Flip flop circuit F91 includes cross-coupled NAND circuits NA91#1 and NA91#2. NAND circuit NA91#1 receives outputs from respective NAND circuits NA93 and NA91#2. NAND circuit NA91#2 receives outputs of respective NAND circuits NA95 and NA91#1.

Flip flop circuit F92 includes cross-coupled NAND circuits NA92#1 and NA92#2. NAND circuit NA92#1 receives outputs from respective NAND circuits NA94 and NA92#2. NAND circuit NA92#2 receives outputs from respective NAND circuits NA95 and NA92#1.

NAND circuit NA95 receives outputs of respective NAND circuits NA93, NA94, NA91#1 and NA92#1. NAND circuit NA96 receives outputs of respective NAND circuits NA93, NA95 and NA91#1. NAND circuit NA97 receives outputs of respective NAND circuits NA94, NA95 and NA92#1. NAND circuit NA96 outputs up signal NUP, and NAND circuit NA97 outputs down signal NDOWN.

Here, note that designations Qd, Qb, Qc, Qe, and Qf represent outputs of NAND circuits NA93, NA91#1, NA95, NA94, and NA92#1, respectively. Phase comparator 90 is reset by signal Qc.

The operation of phase comparator 90 shown in FIG. 32 will now be described with reference to a timing chart shown in FIG. 33.

Figure 33:
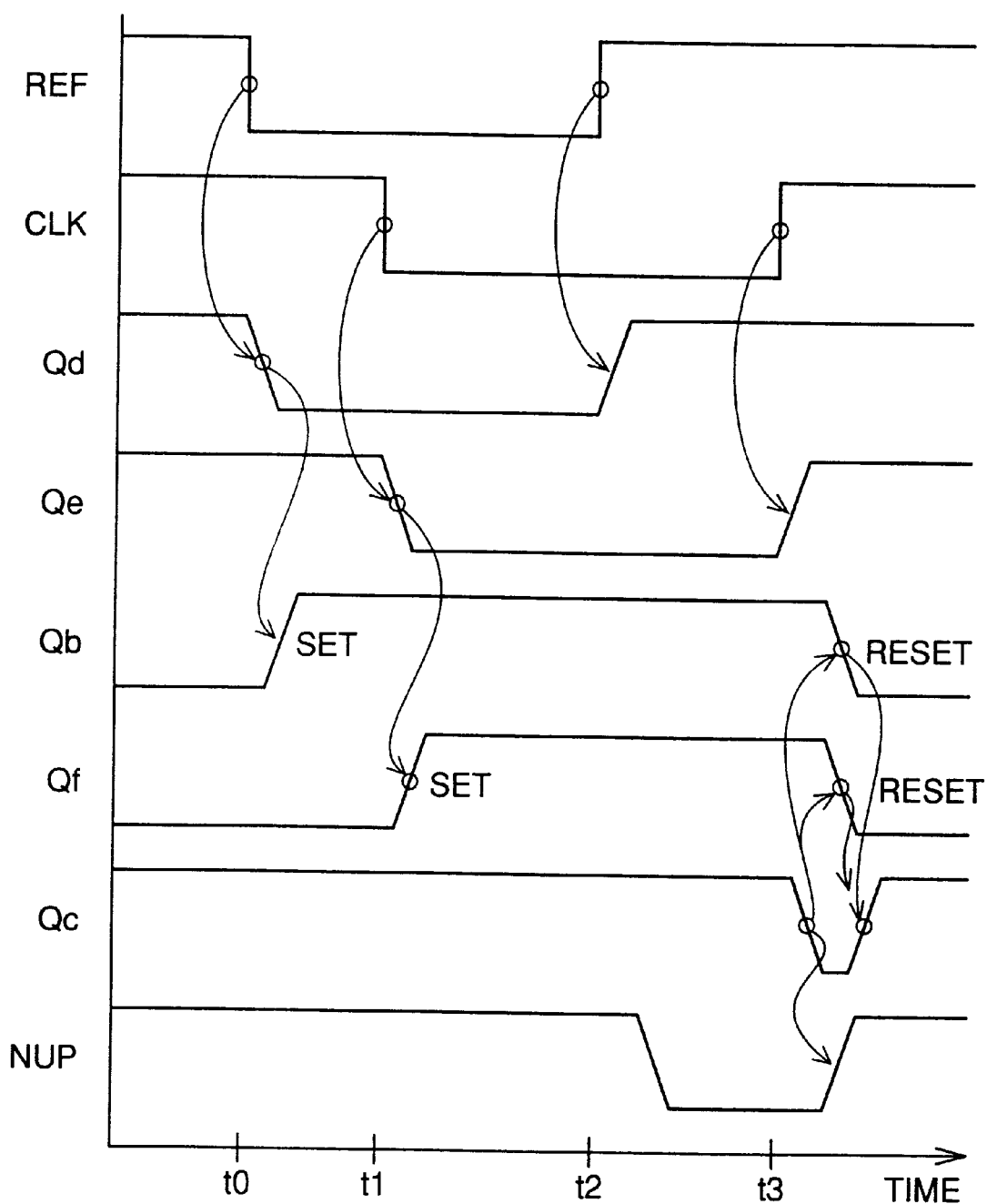
FIG. 33 is a timing chart illustrating the operation of phase comparator 90 shown in FIG. 32.

Referring to FIG. 33, reference signal REF attains an L level at time t0 and an H level at time t2. Clock signal CLK attains an L level at time t1 and an H level at time t3.

When reference signal REF attains the L level at time t0, signal Qd falls to an L level. In response, signal Qb rises to an H level (a set state). When clock signal CLK attains the L level at time t1, signal Qe falls to an L level. In response, signal Qf rises to an H level (a set state).

When reference signal REF attains an H level at time t2, signal Qd rises to an H level. Up signal NUP is made to fall to an L level by signals Qd, Qb and Qc. When clock signal CLK attains an H level at time t3, signal Qe rises to an H level. Signal Qc is made to fall to an L level by signals Qd, Qe and Qb. In response, up signal NUP attains an H level. Further, signal Qc attains an H level. In response, signals Qb and Qf each attain an L level (a reset state).

That is, phase comparator 90 detects the difference between the rising edge of reference signal REF at time t2 and the rising edge of clock signal CLK at time t3, and outputs up signal NUP at the L level.

Phase comparator 90, however, cannot detect a delay difference that is smaller than the width (period being at the L level) of signal Qc. In the case of this circuit, if it consists of three gate stages and each gate takes 0.3 ns, 3×0.5 ns will be the limit for detection.

In contrast, a phase comparator 130 according to the fifth embodiment of the present invention is capable of detecting a minute timing difference between input signals and holding the detected state, of which a configuration will be described with reference to FIG. 34.

Figure 34:
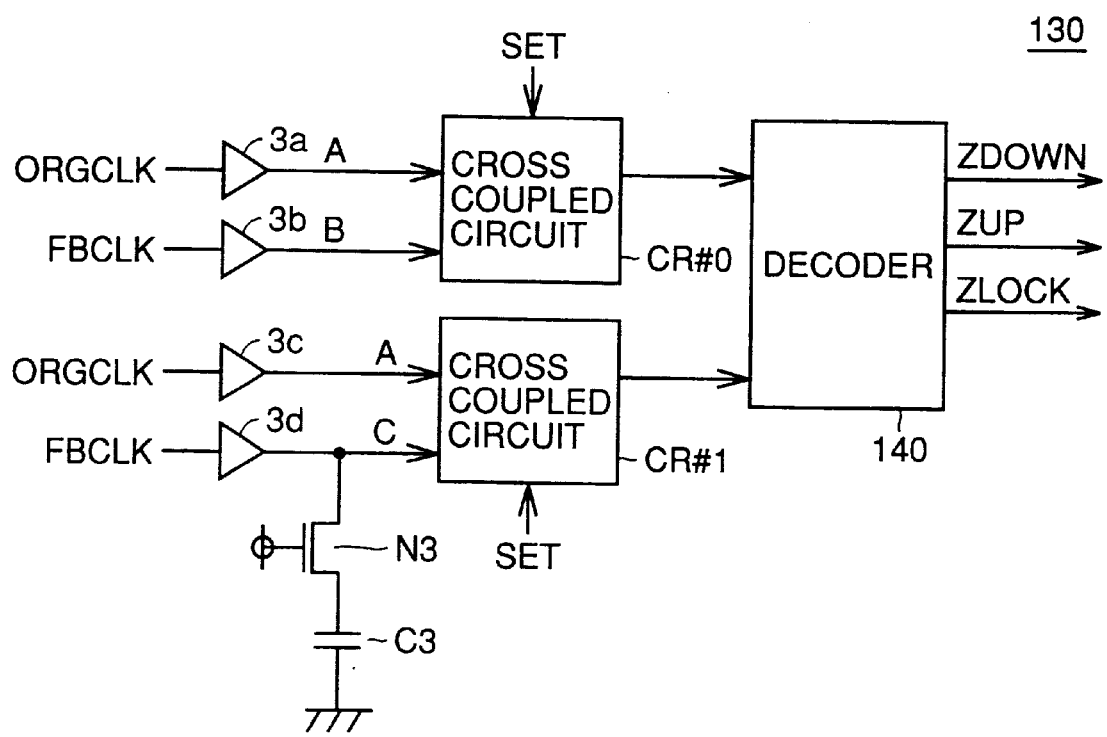
FIG. 34 is a diagram showing a configuration of a phase comparator 130 according to a fifth embodiment of the present invention.

Referring to FIG. 34, phase comparator 130 includes a decoder 140, buffers 3a, 3b, 3c and 3d, cross-coupled circuits CR#0 and CR#1, an NMOS transistor N3, and a capacitor C3.

Buffer 3a takes in clock signal ORGCLK and outputs a signal A to cross-coupled circuit CR#0. Buffer 3b takes in feedback signal FBCLK and outputs a signal B to cross-coupled circuit CR#0.

Buffer 3c takes in clock signal ORGCLK and outputs signal A to cross-coupled circuit CR#1. Buffer 3d takes in feedback signal FBCLK. NMOS transistor and capacitor C3 are connected between an output node of buffer 3d and a ground potential. The gate electrode of NMOS transistor N3 receives a power supply potential.

The potential of an output signal of buffer 3d makes a moderate transition according to capacitor C3 (that is referred to as signal C). Signal C is slightly delayed with respect to signal B. Cross-coupled circuit CR#1 receives signal C. Note that cross-coupled circuits CR#0 and CR#1 are initialized based on a set signal SET, respectively.

An exemplary configuration of cross-coupled circuits CR#0 and CR#1 will now be described with reference to FIG. 35.

Figure 35:
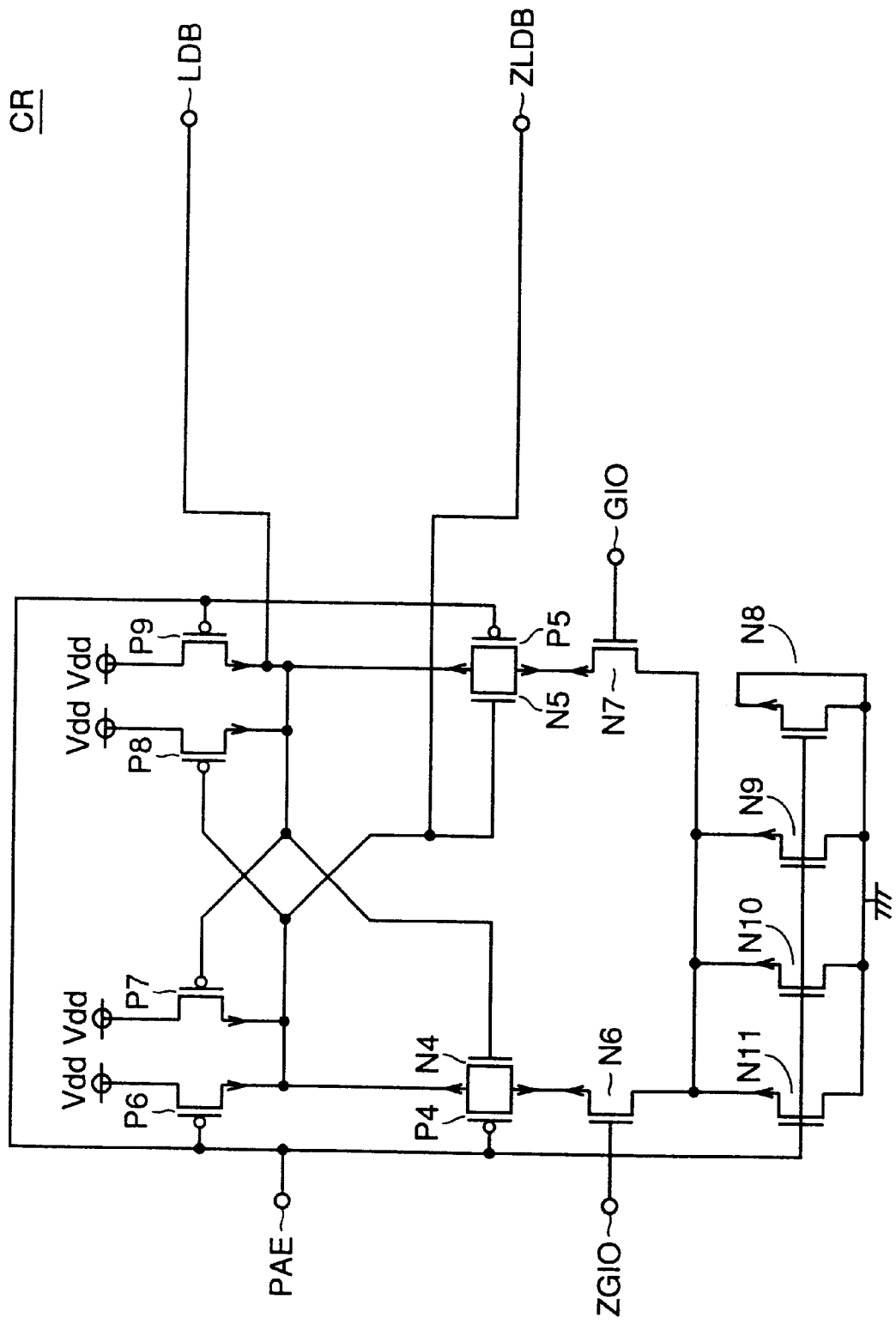
FIG. 35 is a circuit diagram showing an example of a specific configuration of a cross-coupled circuit shown in FIG. 34.

Referring to FIG. 35, cross-coupled circuit (designated as "CR") includes PMOS transistors P4 to P9, and NMOS transistors N4 to N11.

Respective gate electrodes of PMOS transistors P4, P5, P6 and P9, and of NMOS transistors N8 to N11 are connected with a PAE terminal. The gate electrode of NMOS transistor N7 is connected with a GIO terminal. The gate electrode of NMOS transistor N6 is connected with a ZGIO terminal.

Respective gate electrodes of PMOS transistor P7 and NMOS transistor N4 are connected to an LDB terminal. Respective gate electrodes of PMOS transistor P8 and NMOS transistor N5 are connected to a ZLDB terminal.

PMOS transistors P6 and P7 each have one conduction terminal connected to a power supply potential Vdd and the other conduction terminal connected to ZLDB terminal, respectively. PMOS transistors P8 and P9 each have one conduction terminal connected to power supply potential Vdd and the other conduction terminal connected to LDB terminal, respectively.

PMOS transistor P4 and NMOS transistor N4 each have one conduction terminal connected to ZLDB terminal and the other conduction terminal connected to one conduction terminal of NMOS transistor N6, respectively. PMOS transistor P5 and NMOS transistor N5 each have one conduction terminal connected to LDB terminal and the other conduction terminal connected to one conduction terminal of NMOS transistor N7, respectively.

The other conduction terminals of NMOS transistors N6 and N7 are connected with each other. Between this connection node and the ground potential, NMOS transistors N9, N10 and N11 are connected in parallel. Both of the conduction terminals of NMOS transistor N8 are connected to the ground potential.

When a signal (signal SET) at an L level is applied to PAE terminal, LDB terminal and ZLDB terminal both attain an H level. In this state, if a signal at an H level is applied to GIO terminal earlier than that is applied to ZGIO terminal, the potential of LDB terminal falls to an L level. Conversely, if the signal at the H level is applied to ZGIO terminal earlier than to GIO terminal, the potential of ZLDB terminal attains an L level. Thus, a minute signal difference (of 0.1 ns) can be detected using cross-coupled circuit CR.

With reference to FIGS. 34 and 35, cross-coupled circuit CR#0 receives signal A at GIO terminal and signal B at ZGIO terminal. Cross-coupled circuit CR#1 receives signal A at GIO terminal and signal C at ZGIO terminal. Decoder 140 outputs up signal ZUP, down signal ZDOWN or lock signal ZLOCK based on the signals at LDB terminals of respective cross-coupled circuits CR#0 and CR#1.

The operation of phase comparator 130 shown in FIG. 34 will now be described with reference to timing charts in FIGS. 36 to 38.

Figure 36:
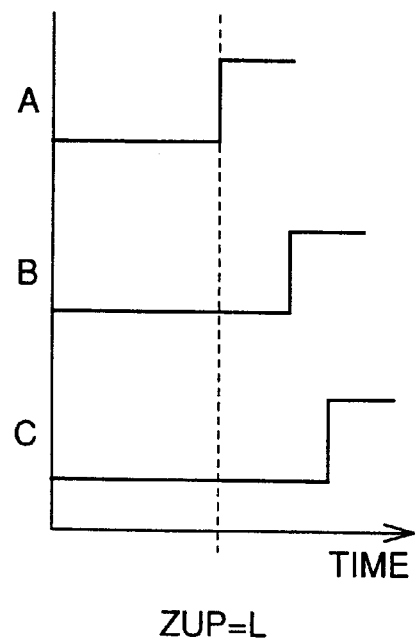
FIGS. 36 to 38 are timing charts illustrating operations of phase comparator 130 shown in FIG. 34.

Referring to FIG. 36, decoder 140 outputs up signal ZUP at an L level when the timings of arrival of signals B and C are lagging behind that of signal A.

Figure 37:
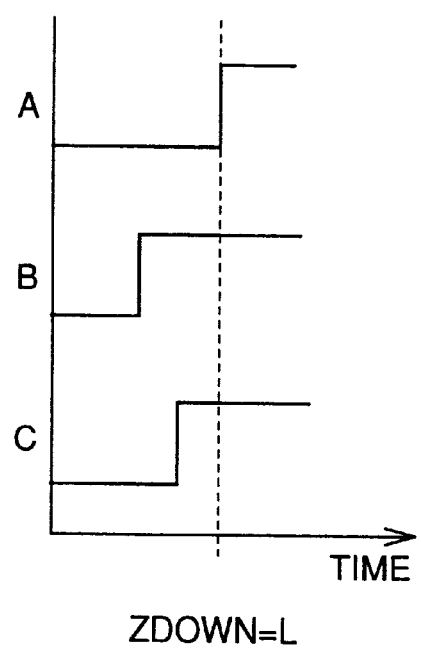

Referring to FIG. 37, decoder 140 outputs down signal ZDOWN at an L level when the arrival timings of signals B and C are ahead of that of signal A.

Figure 38:
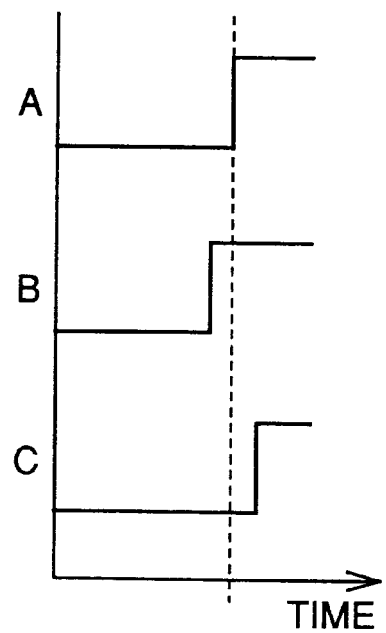

Referring to FIG. 38, decoder 140 outputs lock signal ZLOCK at an L level when signal A arrives later than signal B but earlier than signal C.

As explained above, this phase comparator 130 determines that the phase lock has been established when signal A arrives after signal B and before signal C that is minutely delayed relative to signal B.

By implementing the above-described configuration, phase comparator 130 can realize finer resolution than phase comparator 90. In addition, cross-coupled circuit CR can hold the internal state once it receives set signal SET, until the next set signal SET is input therein. Accordingly, a stable operation is ensured, while a meta-stable can be avoided.

Sixth Embodiment

A testing method of an internal clock signal generating circuit according to the sixth embodiment of the present invention will be described. In the testing method of the internal clock signal generating circuit of the sixth embodiment, the test is conducted using a voltage down converter at the time of laser trimming.

Figure 39:
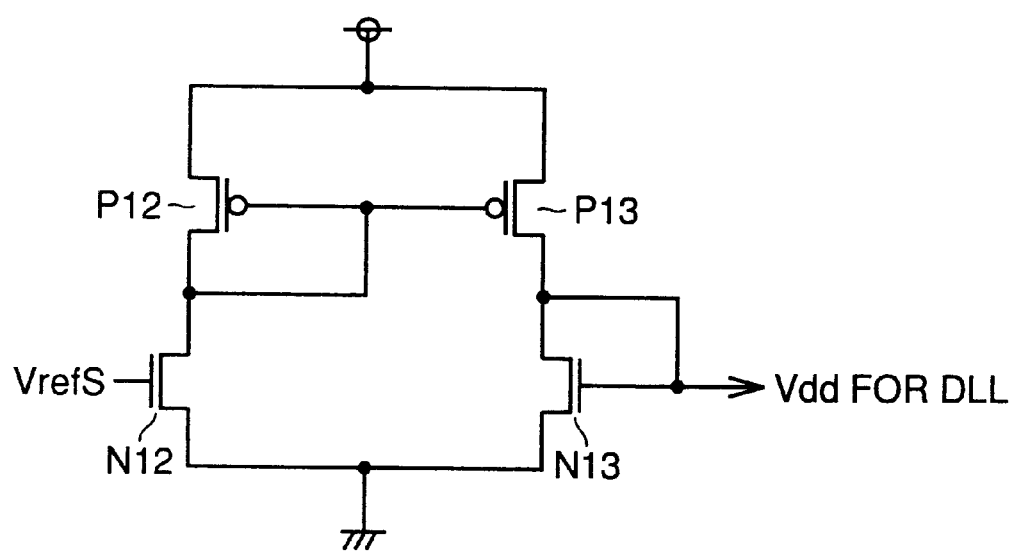
FIG. 39 is a diagram showing a configuration of a voltage down converter 190 for use in a test of internal clock signal generating circuit according to a sixth embodiment of the present invention.

A configuration of the voltage down converter 190 for use in the testing of the internal clock signal generating circuit according to the sixth embodiment will be described with reference to FIG. 39. Referring to FIG. 39, voltage down converter 190 includes NMOS transistors N12 and N13, and PMOS transistors P12 and P13.

NMOS transistor N12 and PMOS transistor P12 are serially connected between the power supply potential and the ground potential.

NMOS transistor N13 and PMOS transistor P13 are serially connected between the power supply potential and the ground potential.

PMOS transistors P12 and P13 each have a gate electrode connected to a connection node between NMOS transistor N12 and PMOS transistor P12. The connection node of PMOS transistor P13 and NMOS transistor N13 is connected to the gate electrode of NMOS transistor N13.

The gate electrode of NMOS transistor N12 receives an externally applied reference potential VrefS. The voltage Vdd at the connection node of PMOS transistor P13 and NMOS transistor N13 is used as a power supply voltage for the internal clock signal generating circuit. This power supply voltage Vdd for the internal clock signal generating circuit alters dependent on the reference voltage.

The internal clock signal generating circuit can be made to lock even in a low-frequency region by lowering the voltage level of the reference voltage. In this testing method, the reference potential is lowered until the internal clock signal generating circuit is locked within a frequency range (e.g., up to 20 MHz) of a low-speed tester used for laser trimming.

A storage circuit (not shown) for storing the locked (phase-locked) state is provided. An RS flip flop circuit, for example, may be used as this storage circuit. Note that the configuration of the internal clock signal generating circuit may be that of a conventional circuit or any one of the circuits according to the first through fifth embodiments described above.

Figure 40:
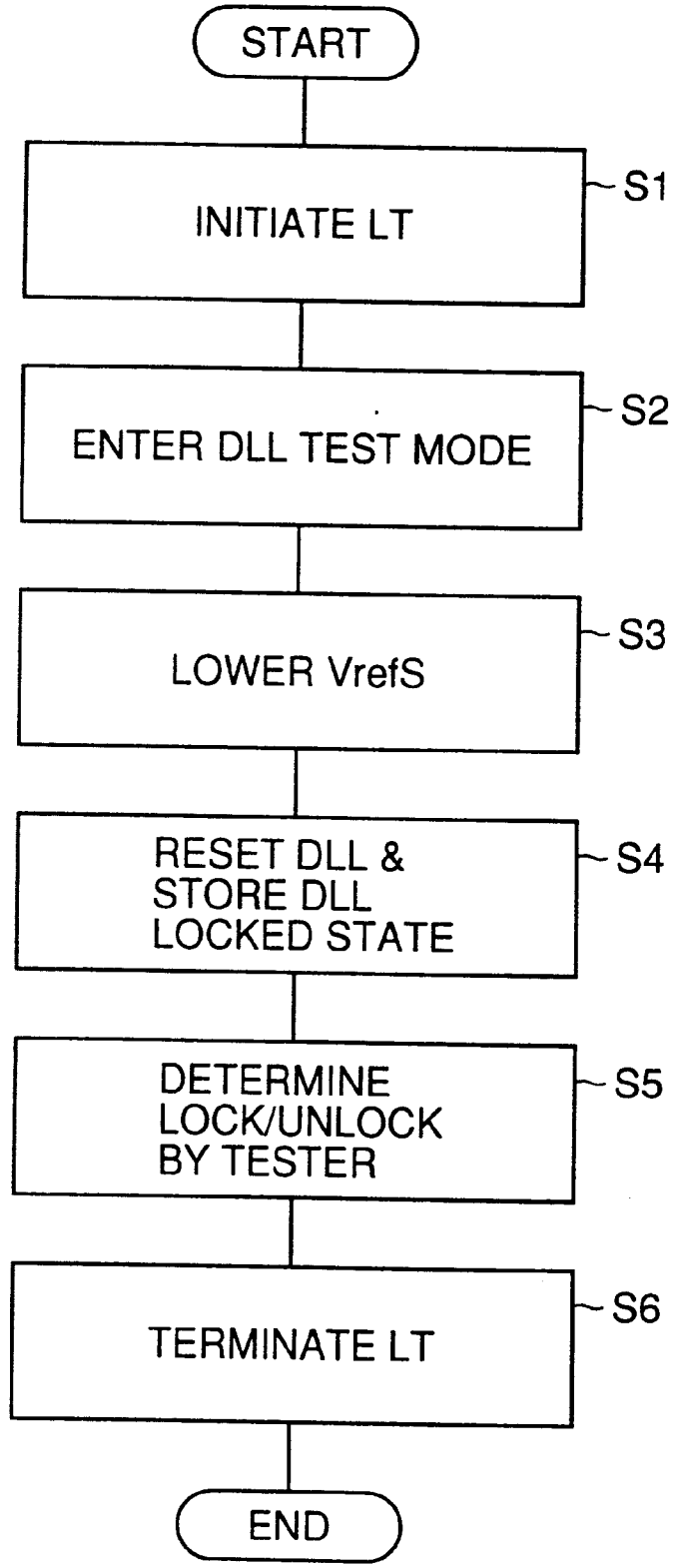
FIG. 40 is a flow chart showing a testing method of the internal clock signal generating circuit according to the sixth embodiment.

The testing method of the internal clock signal generating circuit according to the sixth embodiment will be described with reference to a flow chart shown in FIG. 40. In FIG. 40, the reference character DLL represents the internal clock signal generating circuit.

In step S1, laser trimming is started. In step S2, the internal clock signal generating circuit enters a testing mode. In step S3, reference potential VrefS is lowered.

In step S4, a signal to reset the internal clock signal generating circuit (DLL) is generated. The internal clock signal generating circuit (DLL) is made to operate to achieve phase lock (lock).

In the case of a defective internal clock signal generating circuit, there must be destruction in the feedback loop system, and thus the internal clock signal generating circuit will not be locked.

Moving on to step S5, after a prescribed period of time, e.g., after 500 clocks, a tester is used to determine whether the internal clock signal generating circuit has been locked.

An operation test of the internal clock signal generating circuit can thus be performed using a low-speed tester. Conventionally, it was impossible to test whether the internal clock signal generating circuit operates normally or not before the final test. According to the testing method of the sixth embodiment of the present invention, however, screening can be conducted at laser trimming. Accordingly, it becomes possible to reduce the time necessary for the final test as well as to cut the cost.

Seventh Embodiment

A delay element according to the seventh embodiment of the present invention will be described. The delay element of the seventh embodiment permits a desired delay operation even with a low power supply voltage.

Figure 41:
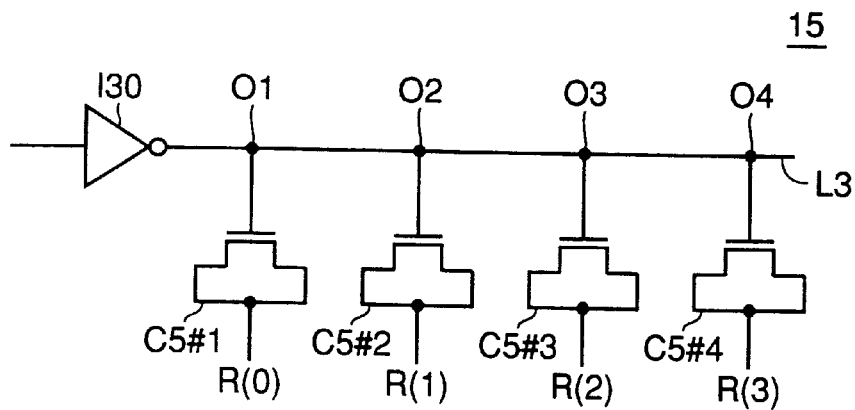
FIG. 41 is a diagram showing a configuration of a delay element 15 according to a seventh embodiment of the present invention.
Figure 42:
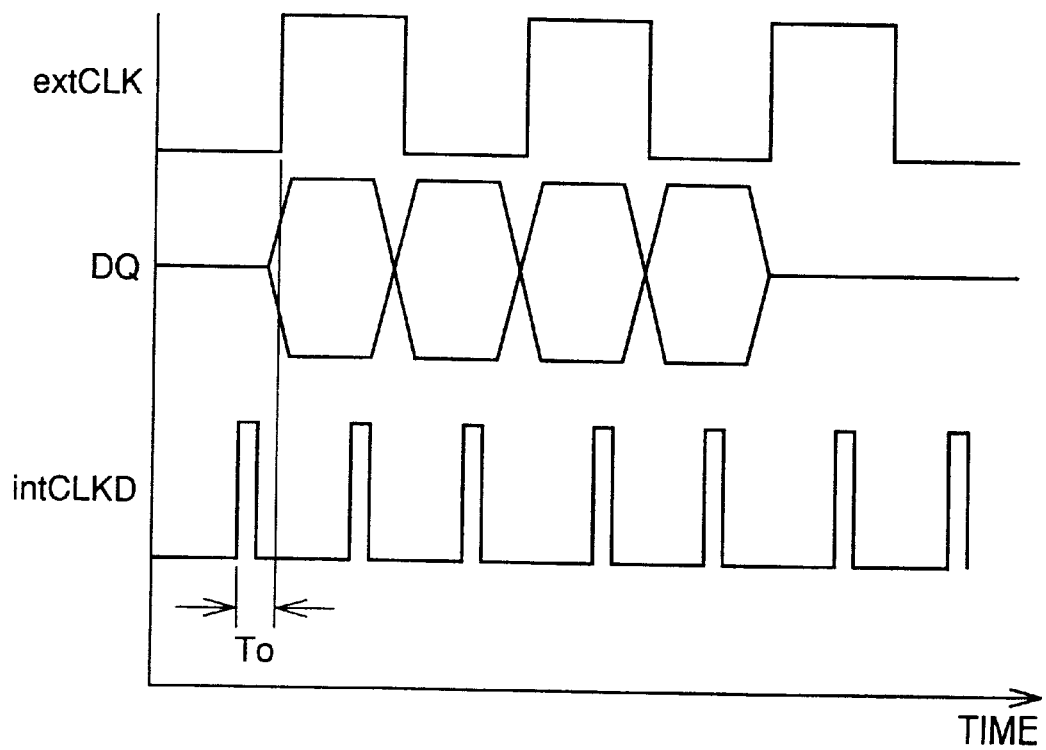
FIG. 42 is a timing chart illustrating output timing in the DDR-SDRAM.
Figure 43:
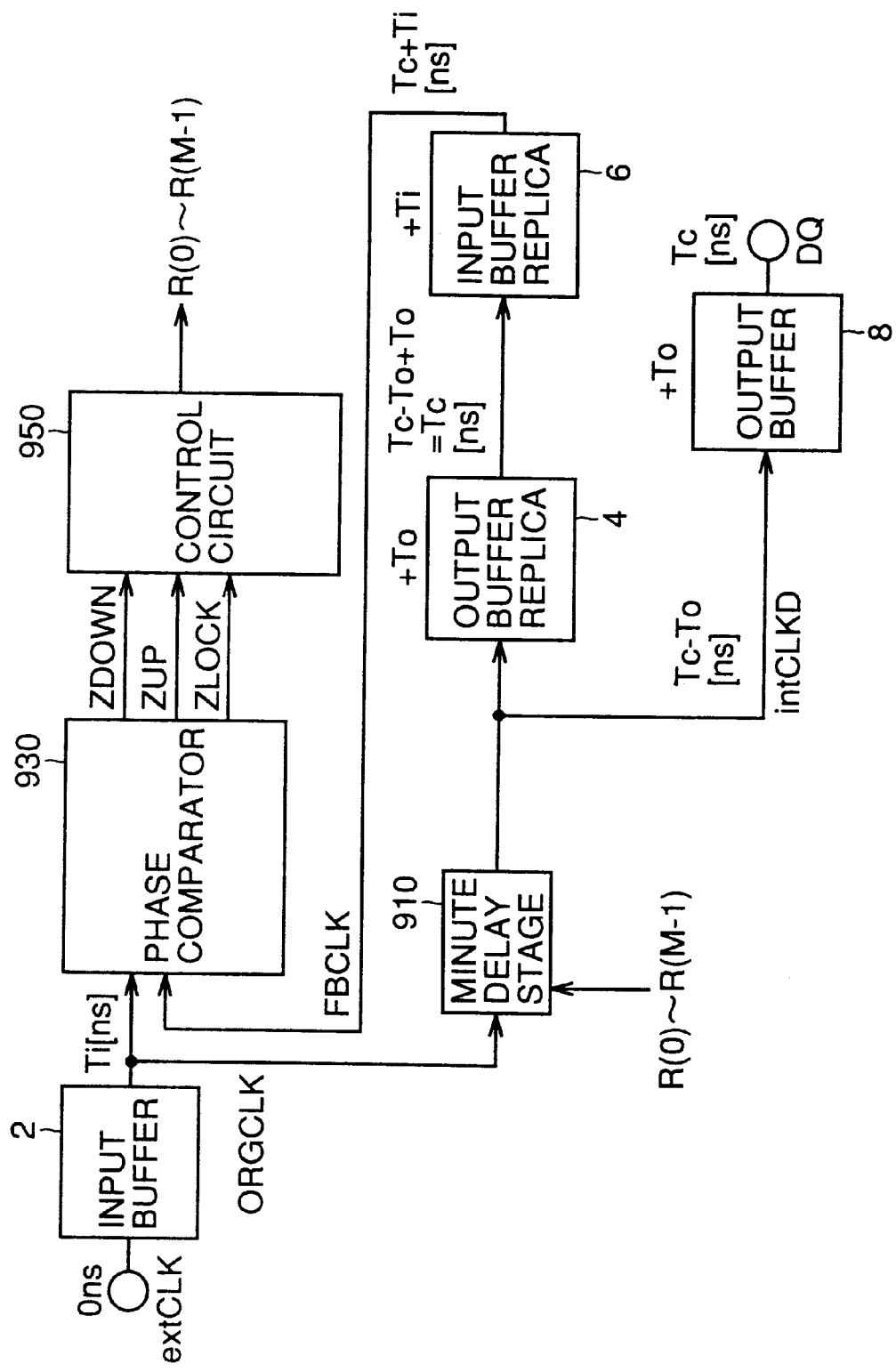
FIG. 43 is a block diagram showing a configuration of the main portion of the semiconductor memory device including a conventional internal clock signal generating circuit.

The delay element I5 according to the seventh embodiment will be described with reference to FIG. 41. Referring to FIG. 41, delay element 15 includes an inverter I30, and MOS capacitors C5#1, C5#2, C5#3 and C5#4.

Inverter I30 outputs a signal via a signal line L3 to a delay element in the succeeding stage. The gate electrode of MOS capacitor C5#1 is connected with signal line L3 at a node O1. The gate electrode of MOS capacitor C5#2 is connected with signal line L3 at a node O2. The gate electrode of MOS capacitor C5#3 is connected with signal line L3 at a node O3. And the gate electrode of MOS capacitor C5#4 is connected with signal line L3 at a node O4.

MOS capacitors C5#1, C5#2, C5#3 and C5#4 each have a conduction terminal receiving from shift registers (not shown) control signals R(0), R(1), R(2) and R(3), respectively. The capacity of each MOS capacitor changes according to control signals R(0) to R(3).

Figure 3:
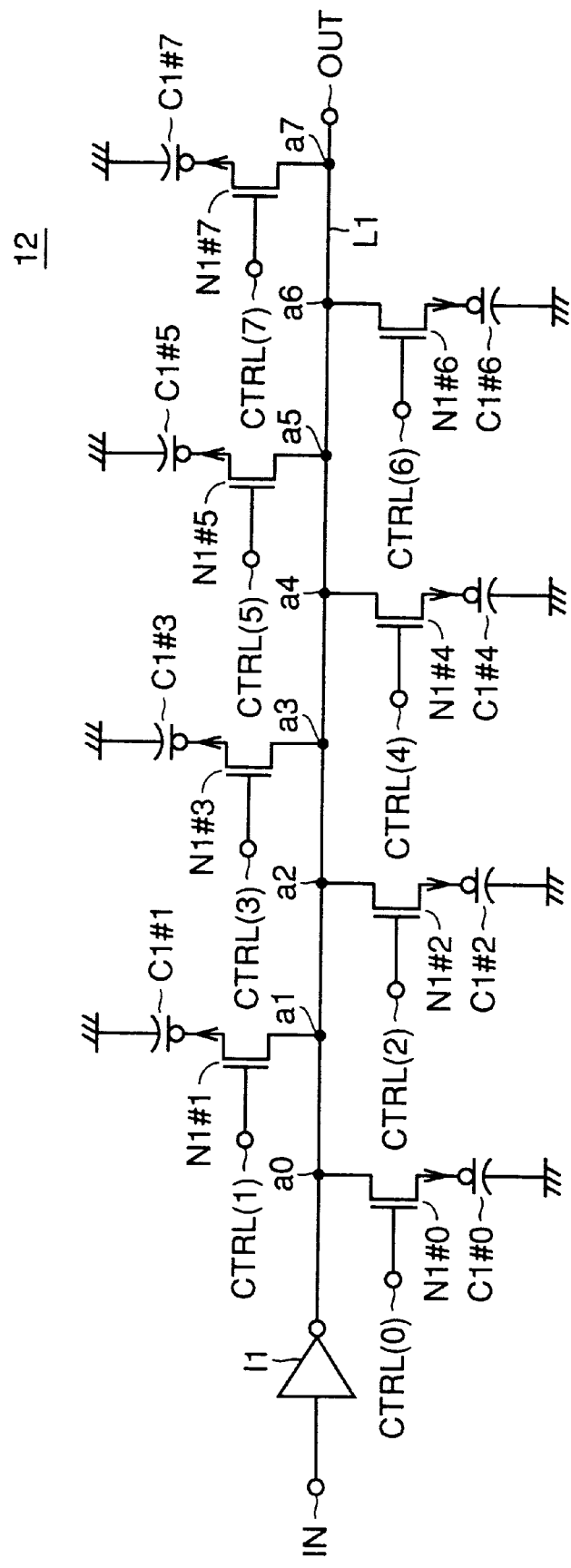
FIG. 3 is a circuit diagram showing an example of a specific configuration of a delay unit shown in FIG. 2.

For example, delay unit 12 shown in FIG. 3 adds a capacitor on a signal transmission path by causing a transistor to turn ON. In FIG. 3, if the resistance of transistor is expressed as R and the capacity of capacitor is expressed as C, the node a0 and the ground potential are electrically connected to each other after a certain time constant RC has passed since the turn-on of transistor N1#0. When using a low power supply voltage, the resistance R of transistor becomes large, and thus the signal may reach a delay element at the succeeding stage earlier than the time constant RC.

In contrast, delay element 15 according to the seventh embodiment of the present invention is not affected by the resistance, since a respective connection node is directly connected to a corresponding capacitor. Accordingly, delay element 15 can realize a desired delay operation even with a lower power supply voltage.

Although the present invention has been described and illustrated in detail, it is clearly understood that the same is by way of illustration and example only, and is not to be taken by way of limitation. The spirit and scope of the present invention is limited only by the terms of the appended claims.

What is claimed is:

1. An internal clock signal generating circuit for generating an internal clock signal synchronized in phase with an externally applied external clock signal, comprising:

a phase difference detecting circuit for detecting a phase difference between said external clock signal and said internal clock signal;

a first delay circuit for selectively delaying said external clock signal by changing a first delay amount applied to said external clock signal by a first time width according to the detected phase difference; and a second delay circuit for selectively delaying the delayed external clock signal from said first delay circuit by changing a second delay amount applied to said delayed external clock signal by a second time width greater than the first time width according to said detected phase difference to output as said internal clock signal, said second delay amount being fixed after the phase difference detecting has started; wherein said phase difference detecting circuit detects that said external clock signal and said internal clock signal are phase-locked and outputs a phase lock signal, and said second delay circuit includes:

a plurality of fixed delay circuits serially coupled to each other, one of said plurality of fixed delay circuits connected to and receiving the delayed external clock signal from said first delay circuit, each of said plurality of fixed delay circuits delaying a signal input therein by a time period that is equivalent to said second time width for output; and a select circuit for selecting either the output of said first delay circuit or one of the respective outputs of said plurality of fixed delay circuits for output as said internal clock signal, and responsive to said phase lock signal for holding a state in which said either one of the outputs is selected at the time of reception of said phase lock signal.

2. The internal clock signal generating circuit according to claim 1, wherein said select circuit includes:

a plurality of gate circuits provided corresponding to the respective outputs of said first delay circuit and said plurality of fixed delay circuits;

a select signal generating circuit for generating a select signal for rendering one of said plurality of gate circuits to a selected state; and a circuit responsive to said phase lock signal for holding a state of said select signal at the time of reception of said phase signal.

3. The internal clock signal generating circuit according to claim 1, further comprising an initial determination circuit for determining a cycle length of said external clock signal within an initial cycle of said external clock signal at an operation start time, wherein said select circuit includes:

a plurality of gate circuits provided corresponding to the respective outputs of said first delay circuit and said plurality of fixed delay circuits;

a select signal generating circuit for generating a select signal for rendering one of said plurality of gate circuits to a selected state, according to said detected phase difference or the cycle length of said external clock signal determined by said initial determination circuit; and a circuit responsive to said phase lock signal for holding a state of said select signal at the time of reception of said phase lock signal.

4. The internal clock signal generating circuit according to claim 1, wherein said phase difference detecting circuit includes:

a phase comparator for detecting said phase difference and for outputting the phase lock signal upon detecting that said external clock signal and said internal clock signal are phase-locked, and a comparison control circuit for shifting said internal clock signal being an object of the detection by said phase comparator according to a cycle length to achieve phase lock.

5. The internal clock signal generating circuit according to claim 1, further comprising an initial determination circuit for determining a cycle length of said external clock signal within an initial cycle of said external clock signal at an operation start time, wherein said phase difference detecting circuit includes;

a phase comparator for detecting said phase difference and for outputting the phase lock signal upon detecting that said external clock signal and said internal clock signal are phase-locked; and a comparison control circuit for shifting said internal clock signal being an object of the detection by said phase comparator according to a cycle length to achieve phase lock, and said select circuit includes:

a plurality of gate circuits provided corresponding to the respective outputs of said first delay circuit and said plurality of fixed delay circuits;

a select signal generating circuit for generating a select signal for rendering one of said plurality of gate circuits to a selected state according to said detected phase difference or to the cycle length of said external clock signal determined by said initial determination circuit; and a circuit responsive to said phase lock signal for holding a state of said select signal at the time of reception of said phase lock signal.

6. An internal clock signal generating circuit for generating an internal clock signal synchronized in phase with an externally applied external clock signal, comprising:

a phase difference detecting circuit for detecting a phase difference between said external clock signal and said internal clock signal;

a first delay circuit for selectively delaying said external clock signal by changing a first delay amount applied to said external clock signal by a first time width according to the detected phase difference; and a second delay circuit for selectively delaying the delayed external clock signal from said first delay circuit by changing a second delay amount applied to said delayed external clock signal by a second time width greater than the first time width according to said detected phase difference to output as said internal clock signal, said second delay amount being fixed after the phase difference detecting has started; wherein said second delay circuit includes:
- a plurality of fixed delay circuits serially coupled to each other, one of said plurality of fixed delay circuits connected to and receiving the delayed external clock signal from the first delay circuit, and each of said plurality of fixed delay circuits delaying a signal input therein by a time period that is equivalent to said second time width for output; and
- a select circuit for selecting either the output of said first delay circuit or one of respective outputs of said plurality of fixed delay circuits according to said detected phase difference for taking out as said internal clock signal;

the internal clock signal generating circuit further comprising an initial determination circuit for determining a cycle length of said external clock signal within an initial cycle of said external clock signal at an operation start time; wherein said select circuit includes:
- a plurality of gate circuits provided corresponding to the respective outputs of said first delay circuit and said plurality of fixed delay circuits; and
- a select signal generating circuit for generating a select signal for rendering one of said plurality of gate circuits to a selected state according to said detected phase difference or the cycle length of said external clock signal determined by said initial determination circuit.

7. An internal clock signal generating circuit for generating an internal clock signal synchronized in phase with an externally applied external clock signal, comprising:
- a phase difference detecting circuit for detecting a phase difference between said external clock signal and said internal clock signal;
- a first delay circuit for selectively delaying said external clock signal by changing a first delay amount applied to said external clock signal by a first time width according to the detected phase difference; and
- a second delay circuit for selectively delaying the delayed external clock signal from said first delay circuit by changing a second delay amount applied to said delayed external clock signal by a second time width greater than the first time width according to said detected phase difference to output as said internal clock signal, said second delay amount being fixed after the phase difference detecting has started;

wherein said second delay circuit includes:
- a plurality of fixed delay circuits serially coupled to each other, one of said plurality of fixed delay circuits connected to and receiving the delayed external clock signal from the first delay circuit, and each of said plurality of fixed delay circuits delaying a signal input therein by a time period that is equivalent to said second time width for output; and
- a select circuit for selecting either the output of said first delay circuit or one of respective outputs of said plurality of fixed delay circuits according to said detected phase difference for taking out as said internal clock signal;

the internal clock signal generating circuit further comprising an initial determination circuit for determining a cycle length of said external clock signal within an initial cycle of said external clock signal at an operation start time; wherein said phase difference detecting circuit includes:
- a phase comparator for detecting said phase difference; and
- a comparison control circuit for shifting said internal clock signal being an object of the detection by said phase comparator according to a cycle length to achieve phase lock, and said select circuit includes:
- a plurality of gate circuits provided corresponding to the respective outputs of said first delay circuit and said plurality of fixed delay circuits; and
- a select signal generating circuit for generating a select signal for rendering one of said plurality of gate circuits to a selected state according to said detected phase difference or the cycle length of said external clock signal determined by said initial determination circuit.

8. An internal clock signal generating circuit for generating an internal clock signal synchronized in phase with an externally applied external clock signal, comprising:
- a phase difference detecting circuit for detecting a phase difference between said external clock signal and said internal clock signal;
- a first delay circuit for selectively delaying said external clock signal by changing a first delay amount applied to said external clock signal by a first time width according to the detected phase difference; and
- a second delay circuit for selectively delaying the delayed external clock signal from said first delay circuit by changing a second delay amount applied to said delayed external clock signal by a second time width greater than the first time width according to said detected phase difference to output as said internal clock signal, said second delay amount being fixed after the phase difference detecting has started; wherein said phase difference detecting circuit includes:
- a first determination circuit receiving as inputs said internal clock signal and said external clock signal for determining which one of said internal clock signal or said external clock signal arrives earlier to generate and hold a first determination signal,
- a second determination circuit receiving as inputs a signal obtained by delaying said internal clock signal by a minute time period and said external clock signal for determining which one of the signal obtained by delaying said internal clock signal by the minute time period or said external clock signal arrives earlier to generate and hold a second determination signal, and
- a circuit for detecting said phase difference based on said first and second determination signals.

9. The internal clock signal generating circuit according to claim 8, wherein
said first determination circuit includes:
- a first determination node reset at the operation start time for outputting said first determination signal after a start of phase lock,
- a second determination node reset at the operation start time,
- a first setting circuit for setting said first determination node by an arrival of said external clock signal and resetting said first determination node by an arrival of said internal clock signal, and
- a second setting circuit for setting said second determination node by an arrival of said internal clock signal and resetting said second determination node by an arrival of said external clock signal; and said second determination circuit includes:
  a third determination node reset at the operation start time for outputting said second determination signal after the start of phase lock,
  a fourth determination node reset at the operation start time,
  a third setting circuit for setting said third determination node by an arrival of said external clock signal and resetting said third determination node by an arrival of the signal obtained by delaying said internal clock signal by the minute time period, and
  a fourth setting circuit for setting said fourth determination node by an arrival of the signal obtained by delaying said internal clock signal by the minute time period and resetting said fourth determination node by an arrival of said external clock signal.

10. An internal clock signal generating circuit for generating an internal clock signal synchronized in phase with an externally applied external clock signal, comprising:
  a phase difference detecting circuit for detecting a phase difference between said external clock signal and said internal clock signal;
  a first delay circuit for selectively delaying said external clock signal by changing a first delay amount applied to said external clock signal by a first time width according to the detected phase difference; and
  a second delay circuit for selectively delaying the delayed external clock signal from said first delay circuit by changing a second delay amount applied to said delayed external clock signal by a second time width greater than the first time width according to said detected phase difference to output as said internal clock signal, said second delay amount being fixed after the phase difference detecting has started; wherein
  said first delay circuit includes:
    a delay element, and
    an MOS transistor connected to said delay element and effecting capacitive-coupling with said delay element according to said detected phase difference;
  said phase difference detecting circuit includes:
    a detecting circuit for detecting said phase difference, and
    a circuit for generating a control signal for controlling the capacitive coupling of said MOS transistor according to said detected phase difference; and said MOS transistor includes:
      a gate electrode connected to said delay element, and
      an impurity diffusion region receiving said control signal.

11. An internal clock signal generating circuit for generating an internal clock signal synchronized in phase with an externally applied external clock signal, comprising:
  a phase difference comparison circuit including a phase comparator for detecting a phase difference between said external clock signal and said internal clock signal, and a comparison control circuit for shifting, by using said internal clock signal itself, said internal clock signal which constitutes a basis for forming a signal being an object of the detection by said phase comparator according to a cycle length to achieve phase lock; and
  a delay circuit for changing a delay amount according to the detected phase difference, for delaying said external clock signal and outputting said internal clock signal.

12. The internal clock signal generating circuit according to claim 11, wherein said comparison control circuit shifts said internal clock signal being the object of said detection by at least one clock.

13. The internal clock signal generating circuit according to claim 11, wherein
  said delay circuit includes:
    a delay line for causing said external clock signal to pass therethrough and outputting said internal clock signal; and
    a variable capacitance circuit including an MOS transistor that is connected to said delay line and effects capacitive-coupling with said delay line according to the detected phase difference.

14. The internal clock signal generating circuit according to claim 13, wherein
  said phase difference comparison circuit further includes:
    a circuit for generating a control signal for controlling the capacitive coupling of said MOS transistor according to said detected phase difference; and said MOS transistor includes:
    a gate electrode connected to said delay line; and
    an impurity diffusion region receiving said control signal.

* * * * *